United States Patent [19]

Miyake et al.

[11] Patent Number: 5,064,520
[45] Date of Patent: Nov. 12, 1991

[54] METHOD AND APPARATUS FOR FORMING A FILM

[75] Inventors: Kiyoshi Miyake, Katsuta; Yasunori Ohno; Masato Isogai, both of Mito; Yukio Nakagawa, Daito; Takayoshi Seki, Hitachi; Koukichi Ouhata; Kenichi Natsui, both of Hitachi; Terunori Warabisako, Tokyo; Keiji Arimatsu, Hitachi, all of Japan

[73] Assignee: Hitachi, Ltd., Tokyo, Japan

[21] Appl. No.: 480,131

[22] Filed: Feb. 14, 1990

[30] Foreign Application Priority Data

Feb. 15, 1989 [JP] Japan ................................. 1-33594
Jun. 21, 1989 [JP] Japan ................................. 1-156787

[51] Int. Cl.$^5$ ............................................. C23C 14/34
[52] U.S. Cl. ......................... 204/192.11; 204/192.12; 204/298.02; 204/298.04; 204/298.23; 204/298.07
[58] Field of Search ................ 204/192.11, 192.12, 204/298.04, 298.02, 298.23, 298.07; 427/38, 53.1

[56] References Cited

U.S. PATENT DOCUMENTS

| | | | |
|---|---|---|---|
| 4,381,453 | 4/1983 | Cuomo et al. | 250/398 |
| 4,416,755 | 11/1983 | Caesar et al. | 204/192.5 |
| 4,637,869 | 1/1987 | Glocker et al. | 204/192.11 |
| 4,664,769 | 5/1987 | Cuomo et al. | 204/192.1 |
| 4,793,908 | 12/1988 | Scott et al. | 204/192.26 |
| 4,892,751 | 1/1990 | Miyake et al. | 427/34 |

Primary Examiner—Nam X. Nguyen
Attorney, Agent, or Firm—Antonelli, Terry, Stout & Kraus

[57] ABSTRACT

This invention relates to a method and an apparatus for forming a film, which are suitable for forming a film of a semiconductor, dielectric, metal, insulator, or organic substance. In order to form a film of high purity and quality at high speed, a particle beam such as an ion beam, an electron beam, or a plasma is applied to a sputtering target comprising a substance formed by bonding atoms or molecules with either van der Waals forces or hydrogen bonding forces, the particles are sputtered thereby from the target, fly in the space in the vacuum chamber, reach the substrate on which they are deposited to form a desired film. To form an organic film free of pinholes, impurities, or disorder in the molecular composition and arrangement in a large area at high speed, a particle beam of about 10 eV or less is applied to the target comprising an organic compound disposed in a vacuum, the particle beam having a level of energy as high as can break the molecular crystalline bonds and not high enough to break the nonmolecular crystalline bonds, out of the molecular crystalline bonds by van der Waals forces connecting the atoms constituting the organic compound and the nonmolecular crystalline bonds by covalent bonds, for example, other than van der Waals forces, and the sputtered particles from the target are deposited on the substrate facing the target to form a desired film of an organic compound.

42 Claims, 18 Drawing Sheets

FIG. 21
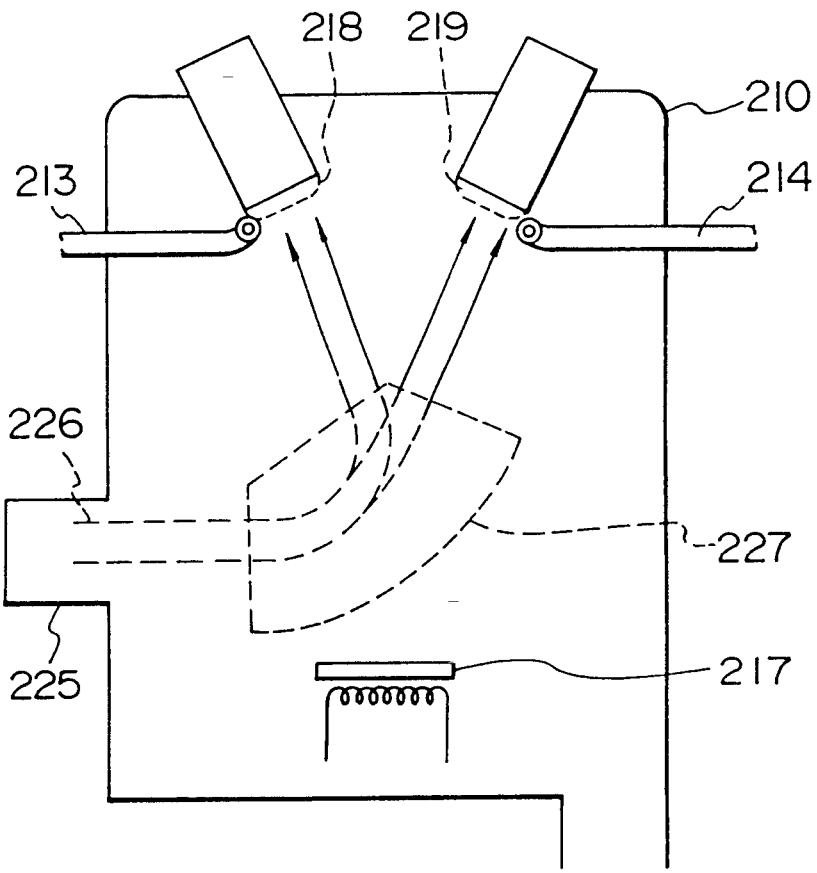
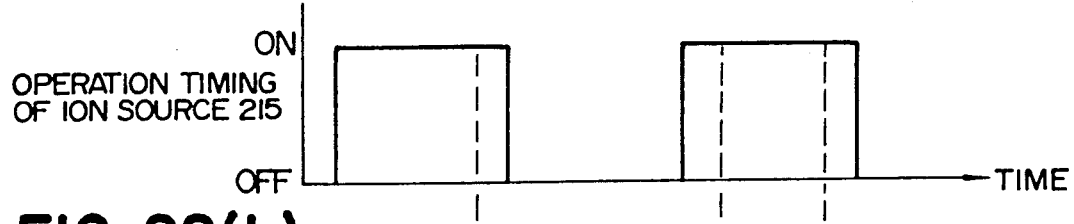
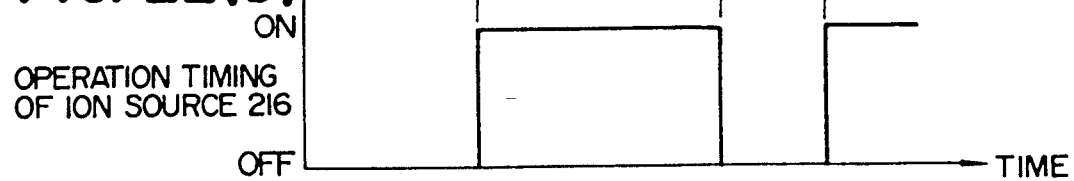

METHOD AND APPARATUS FOR FORMING A FILM

BACKGROUND OF THE INVENTION

This invention relates to a method apparatus for forming a film and more particularly to a method and an apparatus suitable for forming a film of semiconductor, dielelctric, metal, insulator, or organic substance.

It is well known that sputtering is conventionally used for forming a film of metal or dielectric material. As discussed in pages 171 to 195 of "Hakumaku (Thin Film) Handbook" edited by Japan Society for the Promotion of Science (published by Ohmsha, Ltd., December 1983), there are wide range of methods which include DC diode sputtering, bias sputtering, radio-frequency (RF) sputtering and magnetron sputtering, the last one being intended for high-speed film formation. In addition, an ion beam sputter deposition method is also known, which is described in pages 190 and 191 of the above-mentioned literature.

All of these methods utilize sputter ejection of atoms from a substance in the solid state at room temperature which occurs when it is struck by an ion beam or ions in the plasma. In this case, the sputtering mechanism is explained by collision cascade model. Therefore, the film forming speed is limited by the sputtering rate of a substance in the solid state.

On the hand, sputtering is achieved by ion irradiation of a substance in the solidified state made by cooling a gas of carbon monoxide, methane, etc. and combing their molecules by van der Waals forces. As an example, this sputtering method is discussed in "Desorption Induced by Electronic Transition DIET II" pp. 170-176 (compiled by W. Brening, D. Menzel, published by Springer, 1985).

In this case, it is known that the number of atoms and molecules which are decomposed per incident ion by sputtering of a solidified substance of a gas of carbon monoxide or methane, that is to say, the sputtering yield is about 100 to 1000.

Japanese Patent Application JP-A-63-177414 discloses a method in which laser light is irradiated on a gas or a solidified substance to quickly impart energy to this substance in order to convert it into a plasma and a film is formed by using particles produced in the plasma.

Among the prior-art techniques, the sputtering method employing ions and a plasma uses a substance in the solid state at room temperature as a target material for sputtering and forms a film by sputtered particles which are decomposed and sputtered by a sputtering mechanism described in pages 171 to 179 of the above-mentioned "Thin Film Handbook". In this case, the sputtering yield of the target per ion incident on the target is 1 to 10. Accordingly, the problem with this method is the slow film forming speed of 0.1 to 1 nm/sec. In principle, the purity of the deposited film never becomes higher than that of the target for sputtering. When a high-purity target for sputtering is not available, you can obtain only a film of poor quality which contains impurities, which has been another problem.

In a film forming method using a laser-induced plasma, the mechanism whereby plasma particles are produced is such that the target absorbs the energy of photons. Therefore, the kinetic energy of a plasma particle thus produced is smaller than that of a particle sputtered from the target by irradiation by ions having large momentum. For this reason, the deposited film is inferior in adhesion strength to those which are formed by the conventional sputtering methods in which irradiation by ions having large energy is used.

Meanwhile, in depositing an organic film, the wet process has been used chiefly. The feature of this wet process is that a relatively uniform film is formed easily as in the spin coating method and the cast method. Therefore, the wet process is superior in productivity and is applied extensively in film forming processes such as applying a photoresist for photolithography, an insulating film between layers of a semiconductor element, or a liquid crystal arrangement control film of a liquid crystal display element.

In contrast to the foregoing, the vacuum evaporation technique is a dry process in film deposition. There was a report on the formation of an organic single crystal film in "Journal of Applied Physics", volume 36, number 4, April 1965, pp. 1453-1460. According to this method, it is possible to form a film with superior crystallinity and orientation.

The plasma polymerization method is another film forming technique by a dry process. For example, a report on a metallic phthalocyanine plasma-polymerized film was carried by "Journal of the Chemical Society of Japan, No. 11 (1987), pp. 2019-2024. By this method, it is possible to form not only a functional film with an ability of photoelectric conversion, etc., but also a film generally superior in mechanical strength and heat resistance.

In the meantime, the organic film forming method by a wet process has mass-production aptitude and is currently the best film forming method. However, considering technical requirements for an organic film forming method to be used for the development of the next-generation devices, there are some requirements which are hard to meet by the conventional wet processes.

For example, the liquid crystal display needs to meet requirements for further microminiaturization, color display and an enlarged screen. Efforts are being actively exerted to develop a liquid crystal display by the active matrix method, which combines display elements and a driving circuit. In one display, there are tens of thousands to hundreds of thousands of transistors formed on a glass plate several tens of centimeters square. Therefore, it is required to form a uniform photoresist film in the transistor manufacturing process. In the spin coating method, to secure a uniform film thickness, the substrate is rotated at about 3,000 revolutions per minute and a photoresist is applied thereto. As the substrate increases in size, the edges of the substrate turns at a high speed so high as to approach the speed of sound. By technology at the moment, it is impossible to rotate and hold a substrate stably and apply the resist uniformly.

With regard to an insulating film between the layers of a semiconductor element, a problem with the wet process has been pointed out. A polyimide film for use as an insulating film is conventionally made as follows. A diamino compound and tetracarboxylic acid (or its derivative) are polymerized in an organic polar solvent to make a polyamide acid varnish. The polyamide acid varnish is spread across the substrate, then the substrate is heated and dried to obtain a polyimide layer formed on the surface. (Refer to JP-B-36-10999, for example.) With growing needs for higher integration of semiconductor devices as the backdrop, it is required to provide sufficient insulation performance with a film about 1 μm thick. The method mentioned above is unable to eliminate pinholes completely. There is also a problem that mixing-in of impurities is liable to occur. Therefore, a film that can withstand practical application has not been realized by this method.

An organic lubrication layer is formed, unquestionably, by a wet process, to prevent the wear of the surface of the magnetic disk. In order to respond to the needs for an improvement in recording density, the magnetic recording layer, which used to be formed by a wet process, has come to be formed by a dry process. Accordingly, it has become necessary to adopt a dry process for the formation of a lubrication layer to maintain the quality of the film formed and enhance the efficiency of film formation.

In forming an organic film by a dry process, which is to replace the wet process, the vapor evaporation method and the plasma polymerization method have advantages as described above. However, the former method has problems that it is difficult to form a film with a large area, that the film forming speed is slow, and that the number of substances that can be used for vacuum evaporation is limited (for example, the substances which are subject to a polymerization reaction when they are heated for evaporation cannot be used). In the latter method, disorder is liable to occur in the molecular composition and arrangement, and it is difficult to control the molecular chain orientation.

BRIEF DESCRIPTION OF THE DRAWINGS

FIG. 21 is an apparatus arrangement diagram showing an example in which the ion beam irradiation time to a solidified layer is changed by switching of the electromagnetic scanner;

FIG. 22(a), (b) are diagrams showing another example of operation timing of different ion sources;

SUMMARY OF THE INVENTION

Figure 1:
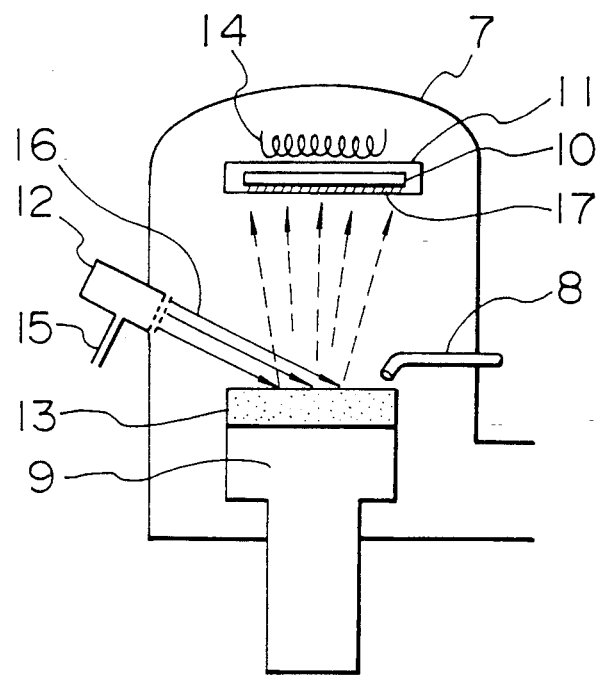
FIG. 1 is a construction of an apparatus in which this invention is applied to a formation of a metallic titanium film.

This invention has been made in consideration of the above situation and has as its object to provide a film forming method and an apparatus therefor whereby a film of high purity and quality can be formed at high speed.

A second object of the present invention is to provide a processing method and an apparatus therefor whereby any workpiece of a metal, dielectric, organic substance or semiconductor can be processed efficiently.

A third object of the present invention is to provide a film forming method which enables the formation in a large area and at high speed of an organic film free of pinholes, impurities and disorder of the molecular composition and arrangement, and an apparatus for embodying this method.

A fourth object of the present invention is to provide a particle beam generator utilizing the sputtering phenomenon to obtain a particle beam of low energy.

The first object can be achieved by applying a particle beam such as an ion beam, electron beam or plasma to a sputtering target formed of a substance made by bonding of atoms and molecules by either van der Waals forces or hydrogen bonding forces in a vacuum, and having the particles dislodged from the target, sputter in the space within the chamber to the substrate on which the sputtered particles are deposited to form a desired film.

As for the sputtering target in this invention, conventionally a substance, which is in a gaseous or liquid state at normal temperature and pressure, is solidified by cooling it to below its melting point, for example, and used as a sputtering target. More specifically, in a conventional sputtering deposition method, a substance, formed of atoms and molecules strongly bonded together by metallic bond, ionic bond or covalent bond at normal temperature and pressure, is used for a sputtering target, and therefore, the sputtering yield has been low. In this invention, on the other hand, a substance weakly bonded by either van der Waals forces or hydrogen bonding forces is used for the sputtering target. Therefore, the sputtering mechanism when ion irradiation is performed on the target differs from the prior art, with the result that the number of sputtered particles per ion is as large as 100 to 1000, making high-speed film formation possible.

The second object mentioned above can be achieved by applying to the substrate the sputtered particles produced by sputtering the target of a substance as described above and processing a desired substrate of a metal, dielectric, organic substance, or semiconductor.

Processing of a substrate material such as a metal, dielectric, organic substance or semiconductor will be made efficient by the use of the operation described above.

The third object mentioned above can be achieved by applying a particle beam to a target of an organic compound in a vacuum, said particle beam having a level of energy as high as can break the molecular crystalline bonds and not so high as can break the non-molecular crystalline bonds, out of the molecular crystalline bonds by van der Waals forces connecting the atoms constituting the organic compound and the non-molecular crystalline bonds by covalent bonds, for example other than van der Waals forces said particle beam having energy less than about 10 eV, and depositing the sputtered particles from the target onto the substrate facing the target, thereby forming a desired film of an organic compound.

To be more specific, when the target formed of the organic compound mentioned above is struck by a particle beam having a predetermined energy described above, out of the molecular crystalline bonds by van der Waals forces connecting the atoms constituting the organic compound and the nonmolecular crystalline bonds by other than van der Waals forces such as the covalent bond (these bonds are sometimes collectively referred to as nonuniform bond type molecular crystals), only the molecular crystalline bonds are broken and the molecules connected by the nonmolecular crystalline bonds eject by sputtering. Some of the sputtered particles reach the substrate, and molecular crystalline bonds are formed again, thus forming an organic compound film.

In an ordinary sputtering film formation, a particle beam of 500 electron volts to several kiloelectron volts strikes the target. Therefore, many of the bonds of the molecules in the organic compound are broken and the target is carbonized. This makes it difficult to form an organic compound on the substrate. In the method according to the present invention, however, the particle beam that strikes the target is extremely low at about 10 eV, and therefore, there is no problem of carbonization of the material substance. In addition, the disorder in the molecular composition or the like in the deposited film is very small.

Since the molecules that scatter by sputtering each have energy of one to several electron volts, a dense film can be formed, and there are less chances for pinholes to occur or for impurities to enter. Furthermore, in this invention, the molecular crystalline bonds are broken by irradiation of the particle beam to cause sputtering. As a result, the sputtering yield is fairly high compared with the prior-art methods, so that a film can be formed at high speed.

The fourth object can be achieved by using a particle generator comprising a vacuum chamber, an introducing pipe for introducing a gas as a material for a particle beam in the vacuum chamber, a cooling plate for cooling the material gas, introduced through the introducing pipe, and holding it below its melting point and having a solidified layer of the material gas formed on the surface thereof, an ion source for ion irradiation of the solidified layer of the material gas formed on the surface of the cooling plate to produce sputtered particles, and an opening, formed at a part of the vacuum chamber, for taking the particles sputtered by the ions.

In the particle generator according to the present invention, a material gas for the particle beam is supplied to the cooling plate in a vacuum, the supplied gas is solidified on the cooling plate, and the thus formed layer is struck by ions of several kilo volts. At this time, a particle beam of low energy can be obtained by taking in a beam form the particles produced by sputtering.

DESCRIPTION OF THE PREFERRED EMBODIMENTS

This invention will now be described with reference to embodiments shown in the accompanying drawings.

FIG. 1 is a diagram showing a construction of an apparatus in which this invention is applied to a formation of a metallic titanium film on a glass substrate.

As shown in FIG. 1, in a vacuum chamber, there are arranged a gas introducing pipe 8 for introducing titanium tetrachloride as a material for metallic titanium, a refrigerator head 9 for solidifying the titanium tetrachloride, a substrate holder 11 in which a glass substrate 10 is mounted, and an ion source 12. The vacuum chamber 7 is evacuated by means of a vacuum pump (not shown) to $1 \times 10^{-7}$ Torr. After this, the refrigerator head 9 is cooled from room temperature down to $-50°$ C., which is below the melting point of $-25°$ C. of titanium tetrachloride and held at that temperature. Then, a vapor of titanium tetrachloride is supplied through the gas introducing outlet 8 and blown against the refrigerator head 9 at a tare of 2 cc/min. Thus, a solidified layer 13 of titanium tetrachloride is formed in 5 min, which is about 100 mm in diameter and 4 mm in thickness. The refrigerator head is sometimes referred to as the target hereinafter.

Meanwhile, a 150-mm diameter, 1-mm thick glass substrate 10 is heated by a heater 14 for heating the substrate and held at 200° C. Then, argon (hydrogen) gas is introduced through a gas introducing hole 15 for the ion source at a flow rate of 0.5 cc/min, and the ion source is operated to apply an argon (hydrogen) ion beam 16, with the ions accelerated to energy of 3 keV, to the solidified layer 13 of titanium tetrachloride. The current quantity of the argon (hydrogen) ion is 1 mA.

As a result of the argon (hydrogen) ion irradiation for 10 min, the solidified layer 13 of titanium tetrachloride was reduced to 1 mm in thickness as it was subjected to sputtering by the argon ions. At the same time, a film 17 with a metallic luster was formed on the glass substrate 10 heated to 200° C.

By an Auger analysis of the film 17, having a luster of a metal and deposited on the glass substrate 10, a spectrum was obtained which indicated the presence of titanium. The impurities in this metal film were less than the detectable limit of Auger analysis, and were carbon was slightly present on the surface of the film and in the interface between the titanium film and the glass substrate. However, chlorine, which might come from the titanium tetrachloride, was not detected. The thickness of this titanium film was found to be 0.6 μm.

In this embodiment, the titanium film was formed of titanium tetrachloride. It is possible to form a film of any metal or semiconductor in the same manner as in this embodiment by cooling a substance which includes elements of the metal or semiconductor and is liquid or gaseous state at normal temperature and pressure to below the melting point of the substance, and making a solidified layer bonded by van der Waals forces.

In the apparatus shown in FIG. 1, a several MeV hydrogen ion beam may be used instead of a 3 keV Argon ion beam. Electron excitation is caused more easily by the hydrogen ion beam. So, a film can be formed at higher speed by the hydrogen ion beam than by the argon ion beam.

Figure 2:
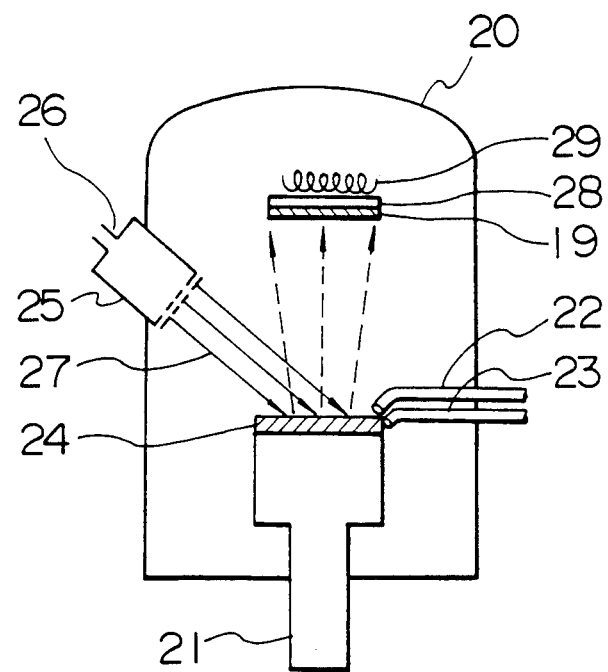
FIG. 2 is a construction of an apparatus in which this invention is applied to a production of titanium silicide.

FIG. 2 is a diagram of a construction of an apparatus in which this invention is applied to a production of a titanium silicide alloy film.

As shown in FIG. 2, after a vacuum chamber 20 was evacuated by a vacuum pump (not shown) to $1 \times 10^{-7}$ Torr, a refrigerator head 21 was held at $-90°$ C. 3 cc of titanium tetrachloride (melting point: $-25°$ C.) and 3 cc of silicon tetrachloride (melting point: $-70°$ C.) were introduced into the refrigerator head 21 through gas introducing ports 22, 23 respectively, and a solidified layer 24 of a mixture of titanium tetrachloride and silicon tetrachloride was formed on the refrigerator head 21. This solidified layer is 40 mm in diameter and about 3 mm in thickness.

Then, neon gas was introduced through a gas introducing port 26 into an ion source 25, and a neon ion beam 27 was drawn out at an acceleration voltage of 1 keV and directed onto the above-mentioned solidified layer 24. At the same time, a 3-in. diameter silicon wafer substrate 28 was arranged in the vacuum chamber 20, and it was heated by a heater 29 and held at 300° C.

After ten minutes of neon beam irradiation, the thickness of the solidified layer 24 was reduced to 1 mm, and a film 19 was deposited on a silicon wafer substrate 28. The thickness of the film 19 was found to be 700 nm. By using a Rutherford ion back scattering method, an elemental analysis was performed of the film 19 and it was clarified that the ratio of titanium to silicon was 2:1. The electric resistance of the film 19 was almost equal to that of a titanium silicide film formed by co-evaporation.

In this embodiment, titanium silicide, a binary alloy, was produced by ion-beam sputtering of the solidified layer of a mixture of two types of gas, titanium tetrachloride and silicon tetrachloride. However, this embodiment is not necessarily limited to two types of gas, but can be applied to the production of various types of films formed of multiple component elements by providing a plurality of gas introducing ports and performing ion-beam sputtering of the solidified layer of a mixture of a plurality of gases.

Figure 3:
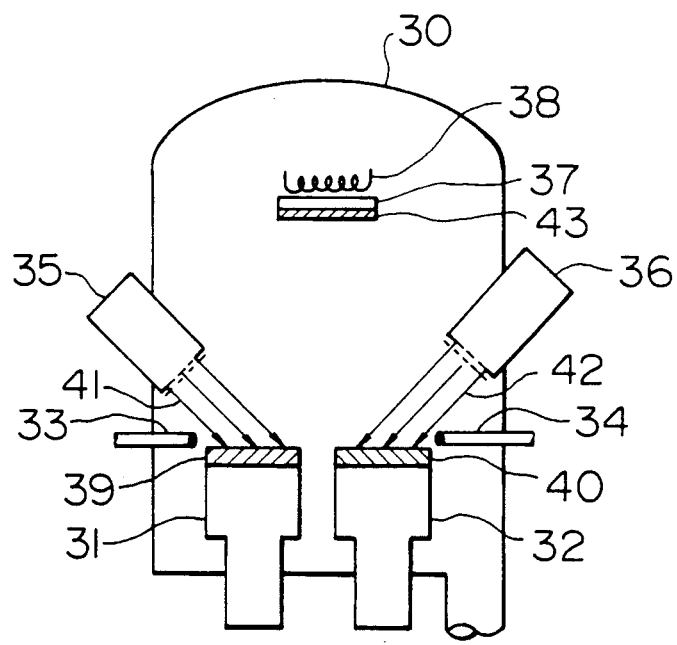
FIG. 3 is a construction of an apparatus in which this invention is applied to a formation of an ultra-thin multilayered film of tungsten and carbon.

FIG. 3 is a diagram showing a construction of an apparatus in which this invention is applied to a production of a multi-element substance or a multi-layered film from a plurality of materials, the melting points of which differ widely.

In this embodiment, a multilayered film of carbon and tungsten is formed by using $CF_4$ (melting point: $-184°$ C.) and $WF_6$ (melting point: $2.3°$ C.).

In a vacuum chamber 30 evacuated to $1 \times 10^{-7}$ Torr, there are arranged two cooling heads 31, 32 identical with the one used in the first embodiment, two gas introduction ports 33, 34, two ion sources 35, 36, and a 3-in. diameter silicon wafer substrate 37. This silicon wafer substrate 37 is heated by a heater 38 and held at 400° C.

The temperatures of the cooling heads 31, 32 were $-200°$ C. and $-10°$ C., respectively. A solidified layer 39 of $CF_4$ and a solidified layer 40 of $WF_6$ were formed by introducing $CF_4$ gas and $WF_6$ gas through the gas introducing ports 33, 34, respectively.

Figure 4:
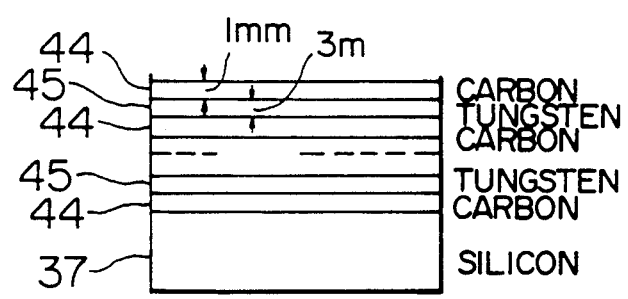
FIG. 4 is a cross-sectional view of an ultra-thin multilayered film of tungsten and carbon.

Neon ion beams 41, 42 were applied to the solidified layer 39 of $CF_4$ and the solidified layer 40 of $WF_6$ at 10-second intervals from the ion sources 35, 36, respectively. In consequence, a multilayered film 43 comprising carbon 44 and tungsten 45 was formed on the silicon wafer substrate 37 as shown in FIG. 4. The thicknesses of the carbon layers 44 and the tungsten layers 45 were 1 nm and 3 nm. The multilayered film 43 of carbon and tungsten formed as described can be used as a mirror for soft X-rays.

In this embodiment, a binary multilayered film was formed by producing two solidified layers and two sputtering mechanisms. However, this embodiment is not limited to a binary multilayered film, but can be applied to a formation of a multilayered film and an alloy film of multi-element complicated structure by forming two or more solidified layers and two or more sputtering mechanisms.

Figure 5:
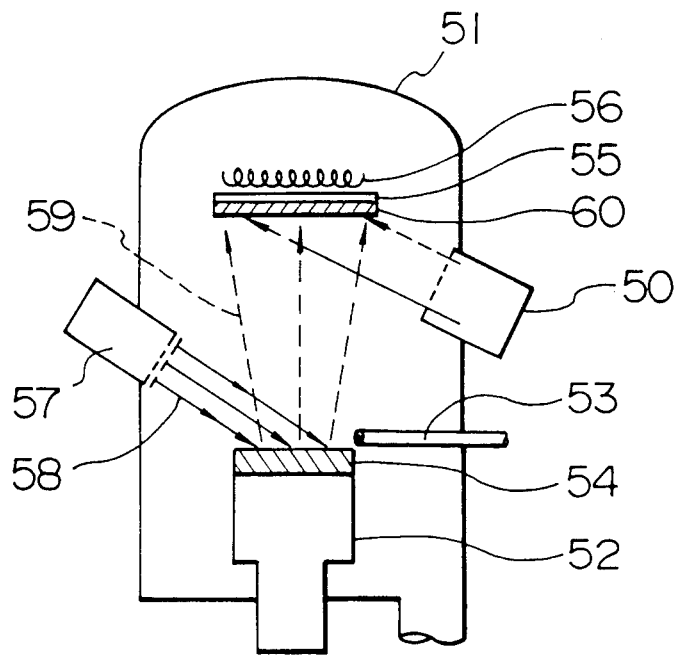
FIG. 5 is a construction of an apparatus in which a device for ion irradiation to a substrate is installed for accelerating a film forming reaction.

FIG. 5 is a diagram showing a construction of an apparatus in which an exciting beam, such as an ion beam, an electron beam or a radical beam is applied to the surface of the substrate simultaneously with the formation of a film in order to form a film of higher quality in the film formation in the embodiment shown in FIG. 1.

The arrangement of this embodiment is the same as that in FIG. 1, excepting that there is further provided an ion source 50 for irradiation of the substrate.

The operation of this embodiment will be described. After a vacuum chamber 51 was evacuated to $1 \times 10^{-7}$ Torr, a cooling head 52 was cooled down to $-50°$ C., 5 cc of SiCl$_4$ gas was introduced through a gas introducing port 53, and a 40-mm dia.×4-mm thick solidified layer 54 of SiCl$_4$ was formed on a cooling head 52. Then, a glass substrate 55 of 100 mm diameter and 1 mm thickness was heated to 200° C. by a heater 56. Argon gas is introduced into the first ion source 57 and argon ion beam 58 was applied with an acceleration energy of 1 keV to the solidified layer 54 of SiCl$_4$ for ten minutes. At the same time, argon gas was also introduced into the second ion source 50, and an argon ion beam was applied with an acceleration energy of 100 eV to the surface of the glass substrate. Consequently, those particles 59 of reaction intermediate products, such as SiCl$_3$, SiCl$_2$ and SiCl, which were sputtered from the solidified layer 54 by irradiation by the first argon ion beam and reached the surface of the glass substrate, further underwent a surface decomposition reaction accelerated by the effects of heating of the substrate and the impact of the ions on the surface of the substrate, with the result that the deposition of a silicon film 60 was accelerated.

When the impurities in the silicon film 60 deposited on the glass substrate 55 were measured by secondary ion composition analysis, the amount of chlorine was less than the detectable limit and nothing but the peaks of isotopes of silicon could be observed. The polycrystalline silicon film obtained was 1 $\mu$m in thickness. Thus, the film forming speed was far faster than when the irradiation by the second ion beam was not carried out.

In this embodiment, argon ion irradiation was performed in order to promote the film forming reaction at the surface of the substrate. However, it is possible to promote the film forming reaction, depending on the nature of a desired film, by applying an electron beam, radical particles of hydrogen for example, or light such as excimer laser light to the surface of the substrate.

Instead of an argon ion beam used in this embodiment, by applying a nitrogen ion beam to the surface of the substrate, a chemical reaction can be caused to take place, thereby forming a silicon nitride film. It is also possible to cause a surface reaction to form a silicon oxide film by applying an oxygen ion beam on the surface of the substrate.

Figure 6:
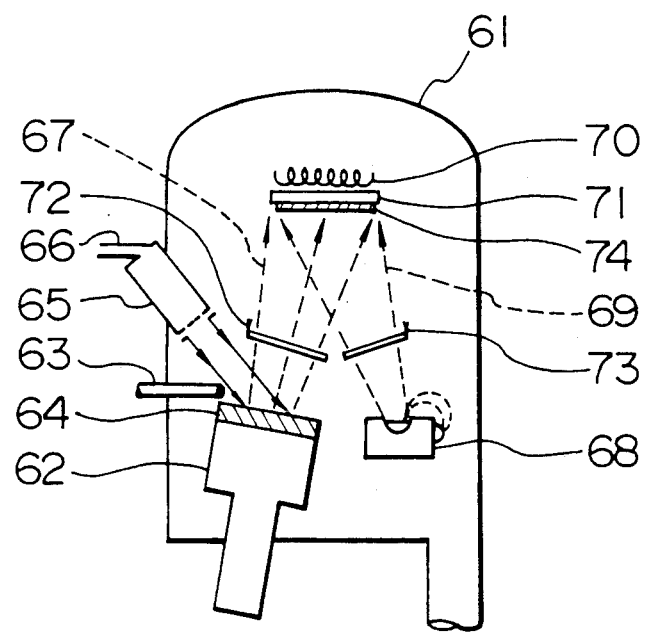
FIG. 6 is a construction of an apparatus in which this invention is applied in combination with the molecular beam deposition method.

FIG. 6 shows a construction of an apparatus in which this invention is applied to the production of a nitride of iron by using a molecular beam evaporation apparatus.

As shown in FIG. 6, in a vacuum chamber 61, evacuated to $2\times10^{-10}$ Torr, of a molecular beam evaporation apparatus, 10 cc of nitrogen gas, the melting point of which is 77K, was introduced through a gas introducing port 63 to a cooling head 62 cooled to 70K. Then, a nitrogen solidified layer 64 of 30 mm diameter and 5 mm thickness was formed on the cooling head 62. At the same time, helium gas 66 was introduced into an ion source 65, the nitrided solidified layer 64 was sputtered by ions with acceleration energy of 1 keV, thus producing sputtered nitrogen particles 67. An electron beam evaporation source 68 containing pellets of pure iron of 5N purity was operated to produce an iron vapor 69.

The sputtered nitrogen particles 67 and the iron vapor 69 thus produced were directed to a GaAs (001) crystal substrate 71 which was heated by a heater and held at 300° C., and shutters 72, 73 were opened and closed alternately for one second at each action. After ten minutes of irradiation, the GaAs crystal substrate 71 was taken out of the vacuum chamber 61, and the composition and structure of a deposited film 74 were analyzed by X-ray diffractometry and Auger elementary analysis. As a result, it was clarified that the film was a nitrided iron film grown epitaxially on the surface of the GaAs crystal. The film thickness was 200 nm and the structure was Fe$_{16}$N$_2$.

As described above, by using a molecular evaporation apparatus and mounting therein a sputtered particle generator according to this embodiment, it is possible to realize a vapor deposition which cannot be accomplished only by the conventional molecular beam evaporation method.

Figure 7:
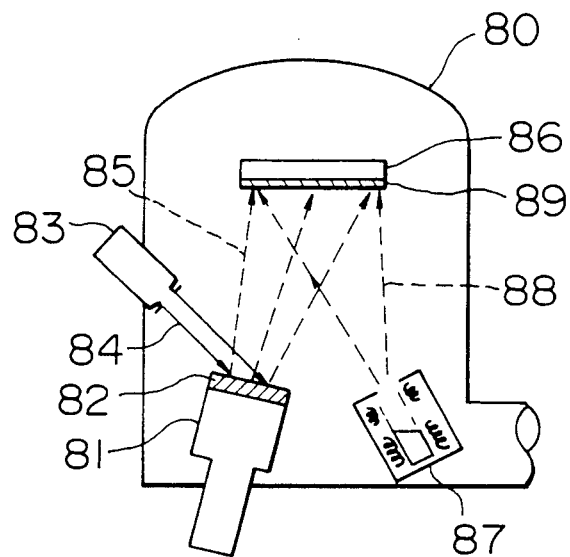
FIG. 7 is a construction of an apparatus in which this invention is applied in combination with the ionized cluster beam deposition method.

FIG. 7 is a diagram showing a construction of an apparatus in which this invention is used to form a metal-scattered organic film by using an ionized cluster beam evaporation apparatus.

As shown in FIG. 7, in a vacuum chamber 80, evacuated to $2\times10^{-7}$ Torr, of an ionized cluster beam evaporation apparatus 87, a cooling head 81 cooled to $-20°$ C. was arranged, on which a solidified layer 82 of methylamine (CH$_3$—NH$_2$) whose melting point is $-93.46°$ C. was formed. The solidified layer was 5 cm in diameter and 5 mm in thickness.

A helium ion beam 84 with acceleration energy of 3 keV and current quantity of 100 $\mu$A extracted from an ion source 83 was applied to the solidified layer 82, whereby sputtered particles 85 were produced which struck a substrate 86. At the same time, gold cluster ions 88 were generated by a gold cluster ion generator 87 disposed in the vacuum chamber 80, accelerated by an acceleration voltage of 8 keV and applied to the substrate 86. For the substrate 86, a 100 mm×100 mm flexible polyimide film with a thickness of 10 $\mu$m, on which a copper film was vapor-deposited to 100 nm thickness, was used.

After subjected to a ten-minute simultaneous irradiation by the sputtered particles 85 and gold cluster ions 88, the flexible polyimide film substrate 86 was taken out of the vacuum chamber 80, and it was found that a C—N—H system organic film 89, containing gold uniformly scattered as well as amino groups, was formed in a thickness of 400 nm. The resistance value of the film changed, affected very sensitively by the amount of moisture in the air, from $10^{-5}$ ohm·cm to $10^{-1}$ ohm—cm.

As discussed above, it is possible to form a film of a new substance by using an ionized cluster beam evaporation apparatus and mounting therein a sputtered ion generator according to this embodiment.

Figure 8:
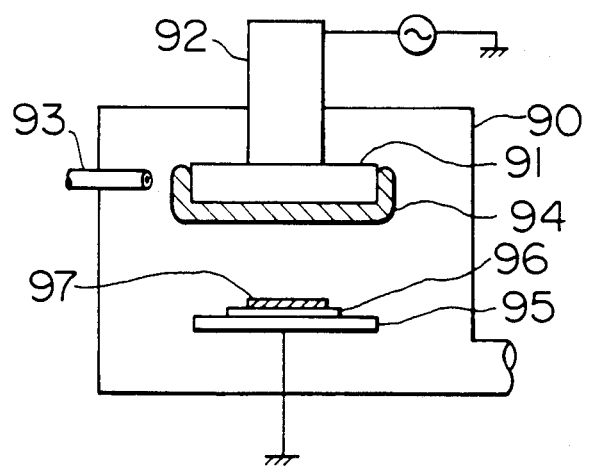
FIG. 8 is a construction of an apparatus in which this invention is applied in combination with the high-frequency diode sputtering deposition method.

FIG. 8 is a diagram showing a construction of an apparatus in which this invention is applied to a high-frequency diode sputtering apparatus to form a cubic-system boron nitride film.

As shown in FIG. 8, at the parallel plates high-frequency sputtering electrodes disposed in a vacuum chamber 90 evacuated to $2\times10^{-7}$ Torr, a refrigerator 92 was connected to an upper electrode 91 to which a high-frequency voltage with a frequency of 13.56 MHz was to be applied, by which the surface of the electrode was cooled to $-150°$ C. Ammonia gas (melting point: $-77.7°$ C.), boron trifluoride (melting point $-127°$ C.) and argon gas (melting point: $-189.2°$ C.) were introduced through a gas introducing port 93 at the rates of 5 cc/min, 10 cc/min and 10 cc/min, respectively, and a solidified layer 94 of a mixture of these gases was formed in a thickness of about 5 mm on the surface of the upper electrode 91.

A silicon wafer substrate 96 with a 3-in. diameter was placed on a lower grounded electrode 95.

Under the above-mentioned condition, while the gas pressure in the vacuum chamber 90 was kept at $3 \times 10^{-4}$ Torr, the high-frequency voltage was applied up to the power of 200 W and argon discharge was performed for 10 min. Then, the film 97 with a thickness of 400 nm deposited on the silicon substrate was measured by X-ray diffractometry, by which the film was found to be boron nitride in a cubic system structure. The hardness was 2000 in terms of Vickers hardness.

In the present embodiment, a method was used in which a solidified layer of a condensed gas was formed at an electrode of the high-frequency diode sputtering apparatus. However, this embodiment can be applied to other types of sputtering apparatuses such as a triode sputtering apparatus or a magnetron sputtering apparatus.

Figure 9A:
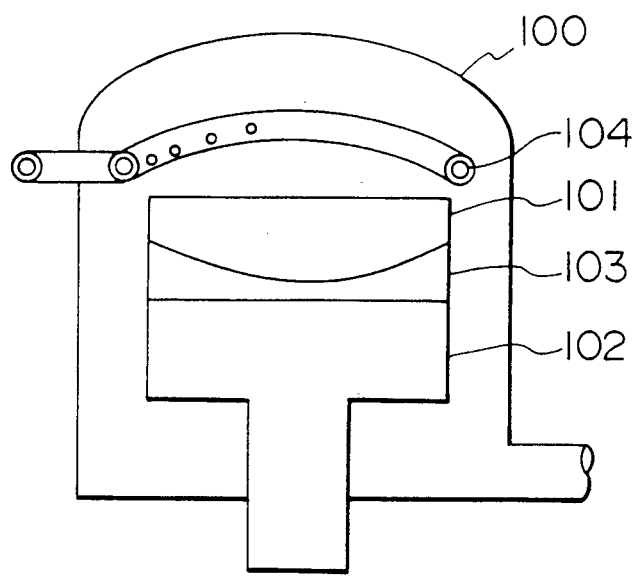
FIG. 9A is a construction of the cooling target for forming a uniform film.
Figure 9B:
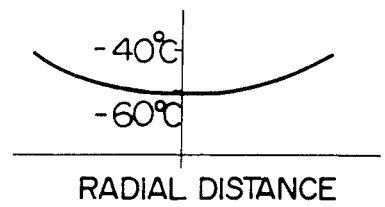
FIG. 9B is a characteristic diagram showing the radial temperature distribution of the cooling target.
Figure 9C:
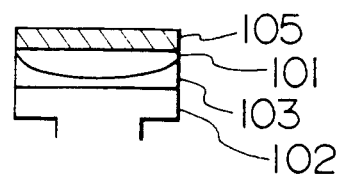
FIG. 9C is a cross-sectional view showing a detail near the cooling target.

FIGS. 9A, 9B, and 9C show an apparatus for forming a uniform solidified layer of a condensed gas. As shown in FIG. 9A, when a copper-made cooling holder 101 with a 10 cm diameter was connected to a cooler head 102 in a vacuum chamber 100, a spacer 103 was inserted therebetween so that the temperature at the surface of the cooling holder would be $-60°$ C. at the center and $-40°$ C. at the peripheral part and a gas introducing port 104 having 400 small holes 0.1 mm in diameter bored around the circumference of the port was arranged near the cooling holder 101. Consequently, the temperature distribution in the radial direction of the surface of the cooling holder during cooling was such that the temperature was low at the center and high at the peripheral part close to the gas introducing port 104, as shown in FIG. 9B. Titanium tetrachloride gas was introduced at the flow rate of 2 cc/min, a solidified layer 105 of titanium tetrachloride 4 mm thick was formed uniformly on the surface of the 10-cm diameter copper-made cooling holder 101, as shown in FIG. 9C, and the variation in the film thickness was less than 5%.

By performing temperature control so that in the temperature distribution of the cooling holder surface, the temperature of the part far from the gas introducing port is lower than the part close to the gas introducing port, it is possible to form a solidified layer with uniform thickness whatever gas is used as the material gas.

Figure 10:
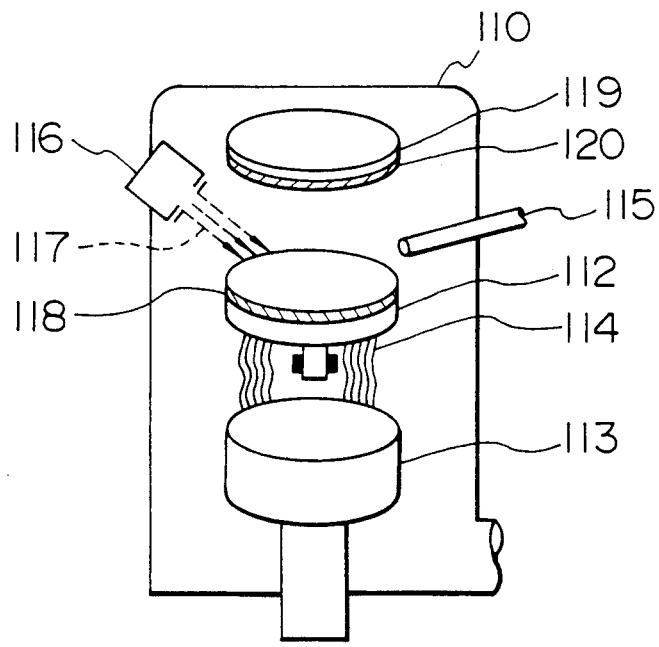
FIG. 10 is a construction of the cooling target for forming a uniform film.

FIG. 10 shows an arrangement of the cooling target for forming a uniform film, which is used in this invention.

As shown in FIG. 10, in a vacuum chamber 110, an 8-cm cooling target, on which a solidified layer 118 was to be deposited, was so constructed as to rotate by means of a bearing. Between the rotary cooling target 112 and the refrigerator head 113, there was provided a bundle of thin copper wires 114 with high thermal conductivity, which connected the target and the refrigerator head loosely. When the rotary cooling head 112 was rotated at a speed of one revolution per minute with the refrigerator head 113 kept at $-80°$ C., the temperature of the surface of the cooling target 112 became $-50°$ C.

Under the above-mentioned condition, titanium tetrachloride gas was supplied at the flow rate of 0.5 cc/min through a gas introducing port 115 disposed near the outer periphery of the cooling target 112. Also, a helium ion beam 117, extracted from an ion source 116 attached to the vacuum chamber 110, was applied with an acceleration voltage of 1 keV to the titanium tetrachloride solidified layer 118 formed on the rotary target 112 to sputter particles therefrom. Thus, a titanium metal film 120 was formed on a 100-mm diameter glass substrate 119 disposed in the vacuum chamber 110, the variation in the film thickness was less than 3%.

In the present embodiment, the cooling target 112 was rotated at a fixed speed. Therefore, even if the helium ion beam 117 was used for sputtering, since the solidified layer 118 is always formed steadily, the condition in which sputtered particles are generated from the solidified layer 118 becomes constant, thus making it possible to form a uniform film.

In the present embodiment, the cooling target 112 was rotated with respect to the gas introducing port 115 and the ion beam 117. However, the same effect can be obtained by moving the cooling target 112 relative to the gas introducing port 115 and the ion beam 117 by using, for example, means for causing the cooling target 112 to make a linear reciprocating motion.

Figure 11:
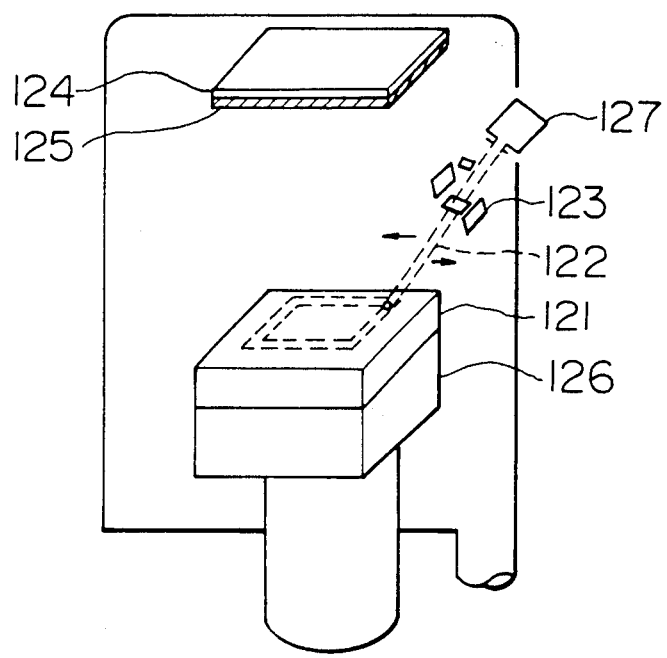
FIG. 11 is a principle diagram of the cooling target sputtering method for forming a uniform film on a substrate with a large area.

FIG. 11 is a construction diagram showing the principle of the method for controlling in time sequence the irradiating position of the ion beam to sputter the surface of the large-area condensed gas solidified layer in order to form a uniform film on a substrate with a large area.

A solidified layer 121 of titanium tetrachloride was formed in a 5-mm thickness on the surface of a 40-cm square cooling target 126, a helium ion beam 122, extracted from an ion source 127, was applied to the surface as it was operated electrically in a two-dimensional operation by means of a scanning electrode 123, and the 30-cm square area of the solidified layer 121 was irradiated. As a result, a titanium metal film 125 was formed successfully in a uniform film thickness of 500 mm on a glass substrate 124 measuring 30 cm $\times$ 30 cm $\times$ 1 mm.

In the present embodiment, the ion beam was operated by an electrical method. However, it is also possible to form a uniform film in a large-area region by moving a substrate, on which a film is to be formed, relative to the cooling target.

Figure 12:
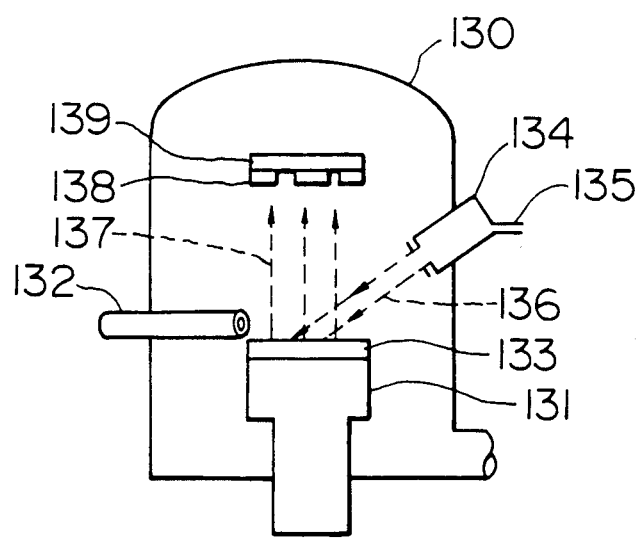
FIG. 12 is a construction of an apparatus in which this invention is applied to etching of a silicon semiconductor.

FIG. 12 is a diagram showing a construction of an apparatus in which this invention was applied to the etching of a silicon semiconductor by sputtering a solidified layer of sulfur hexafluoride with an ion beam.

As shown in FIG. 12, after a vacuum chamber 130 was evacuated by a vacuum pump to $1 \times 10^{-7}$ Torr, a refrigerator head 131 was held at $-100°$ C., 3 cc of sulfur-hexafluoride (melting point: $-50.8°$ C.) was introduced to the refrigerator head 131 through a gas introducing port 132, so that a solidified layer 133 of sulfur-hexafluoride was formed on the refrigerator head 131. The solidified layer 133 was 40 mm in diameter and about 5 mm in thickness.

Then, argon gas was introduced into an ion source 134 through a gas introducing port 135, an argon ion beam 136 was extracted with an acceleration voltage of 1 keV and applied to the solidified layer 133 to generate sputtered particles of radicals 137, such as F, SF, $SF_2$, $SF_3$, $SF_4$, and $SF_5$.

A 3-in. diameter silicon wafer substrate 139, on which a pattern had been formed with a photoresist mask 138, was arranged in the vacuum chamber 130, and the sputtered radicals 137 were applied to the surface of the substrate for ten minutes. As a result, the thickness of the solidified layer 133 was reduced to 1 mm, and those regions at the surface of the silicon photoresist mask 138 were etched to a depth of 2 $\mu$m.

In the present embodiment, the solidified layer of sulfur-hexafluoride was sputtered by ion beams in order to etch a silicon semiconductor. In this invention, however, if a solidified layer capable of providing radical seeds, which chemically react with a workpiece to be processed, like halogen atoms, is used, any workpiece can be processed.

Figure 13:
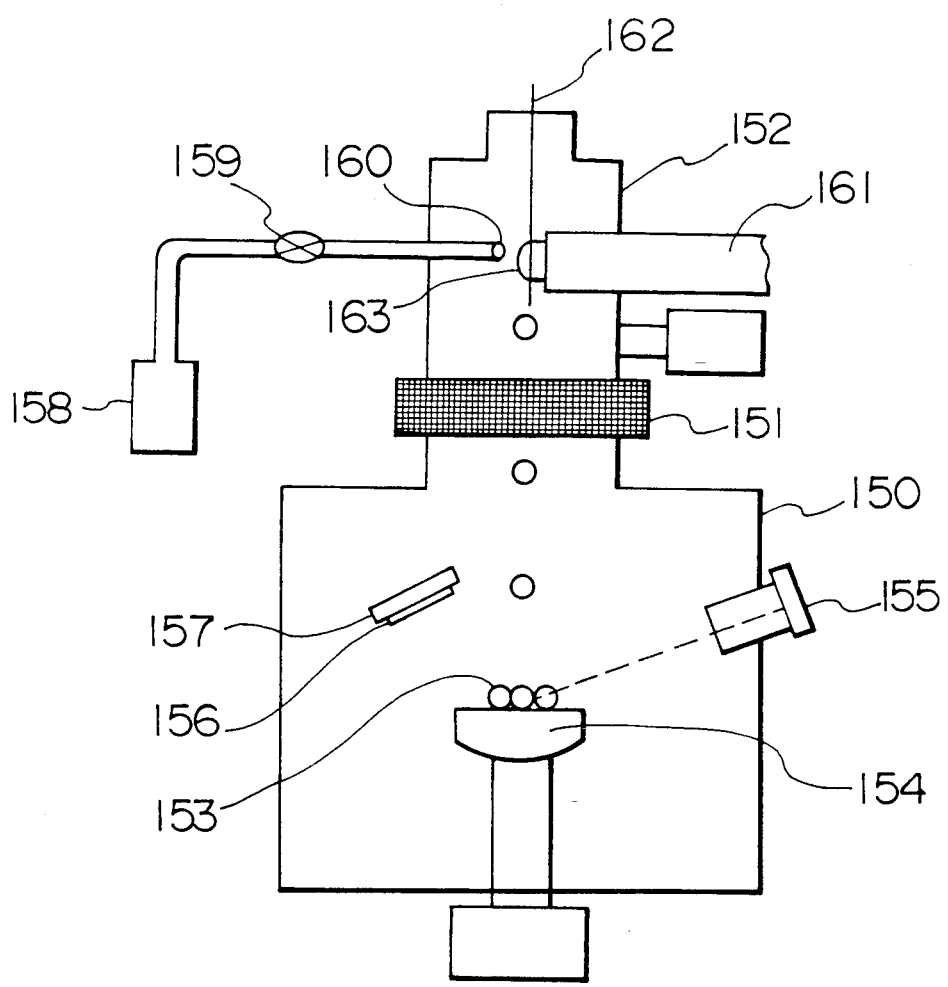
FIG. 13 is a diagram showing a construction of an apparatus in which this invention is applied to a formation of a film by making a solidified substance in a place separate from a chamber where a film is formed and introducing this substance into the chamber.

FIG. 13 shows an apparatus for forming a titanium film by a method according to this invention, in which a solidified bar 163 of titanium tetrachloride is formed in a place separate from a vacuum chamber 150 for forming a film, and then titanium tetrachloride in solid state is introduced into the vacuum chamber 150.

As shown in FIG. 13, the vacuum chamber 150 is connected to another vacuum chamber 152 through the intermediary of a gate valve 151. In the vacuum chamber 150, there are provided a target holder 154 for storing solidified pieces 153 of titanium tetrachloride, an ion source 155, and a glass substrate 157 on which a titanium film 156 is to be formed.

To the vacuum chamber 152, there are attached a vessel 158 containing titanium tetrachloride, a gas leak valve 159, a gas introducing pipe 160, a refrigerator 161, and a solidified piece transfer head 162.

After the vacuum chamber 152 was evacuated to $1 \times 10^{-6}$ Torr, the refrigerator 161 was operated to bring the temperature of the refrigerator head to $-50°$ C. Then, the gas leak valve 159 was opened to introduce titanium tetrachloride gas into the vacuum chamber 152 to bring the pressure in the vacuum chamber 152 to $1 \times 10^{-2}$ Torr. When the gas leak valve 159 was closed 30 minutes later, a solidified bar 163 of titanium tetrachloride about 5 mm thick had been formed on the refrigerator head 161, and the degree of vacuum had returned to $1 \times 10^{-6}$.

At this time, the gate valve 151 had been closed and the vacuum chamber 150 had been evacuated by another vacuum pump to $1 \times 10^{-9}$.

Then, an approximately 3-mm piece was cut off from the solidified bar 163 of titanium tetrachloride, the gate valve 151 was opened, and the above-mentioned piece was transferred onto the target holder 154 by using the solidified piece transfer head 162.

The solidified piece transfer head 162 was brought back into the vacuum chamber 152, the gate valve 151 was closed and a solidified bar of titanium tetrachloride was formed again on the refrigerator head 161 in the same manner as before. By repeating the above operation ten times, ten small pieces of solidified titanium tetrachloride were placed on the target holder 154.

By the same method as described with reference to FIG. 1, argon gas was introduced into the vacuum chamber 150, the solidified pieces of titanium tetrachloride were sputtered by the argon ion beam with an acceleration energy of 3 keV, produced by the ion source 155, thereby forming a 0.6 $\mu$m titanium film 156 was formed on the glass substrate 157.

According to this method, only titanium tetrachloride in solid state is introduced into the vacuum chamber 150, the titanium tetrachloride gas is less liable to be adsorbed on the inside wall of the vacuum chamber 150, and the vacuum level can always be kept low in the vacuum chamber 150. Therefore, the vacuum chamber 150 can always be kept clean, resulting in an improved quality of the deposited film. In addition, the life of the vacuum chamber 150 is prolonged.

Figure 14:
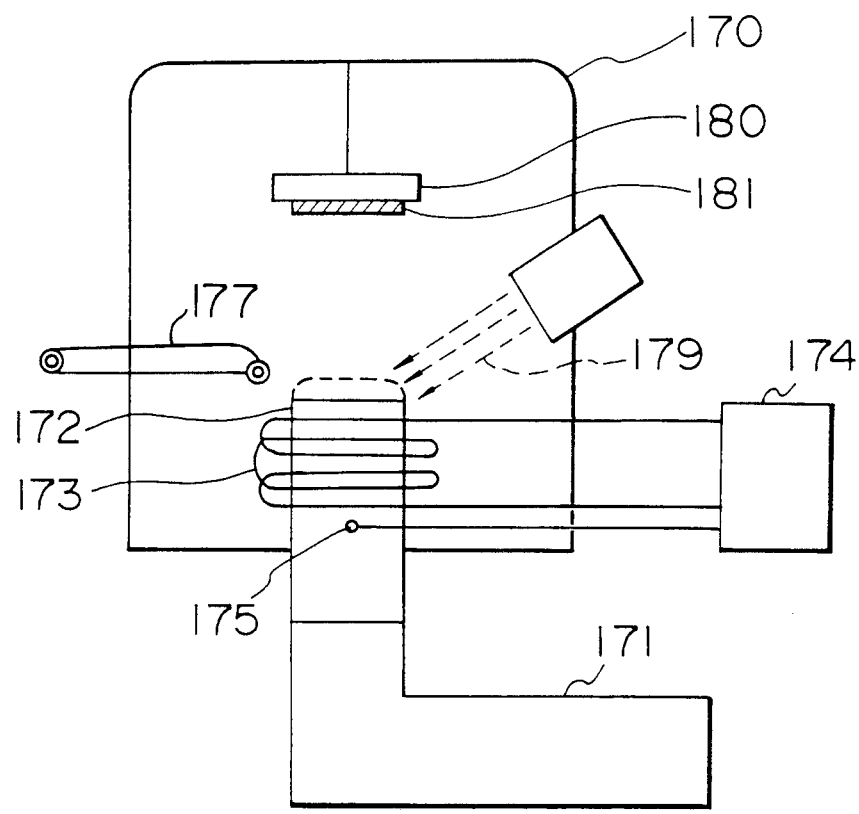
FIG. 14 is a construction of an apparatus for forming a solidified layer of a material gas whereby in producing a substance bonded by van der Waals forces, only components, which you do not want included in the film, are first solidified out of the gases remaining in the vessel, and then a desired solidified layer of a material gas is formed.
Figure 15:
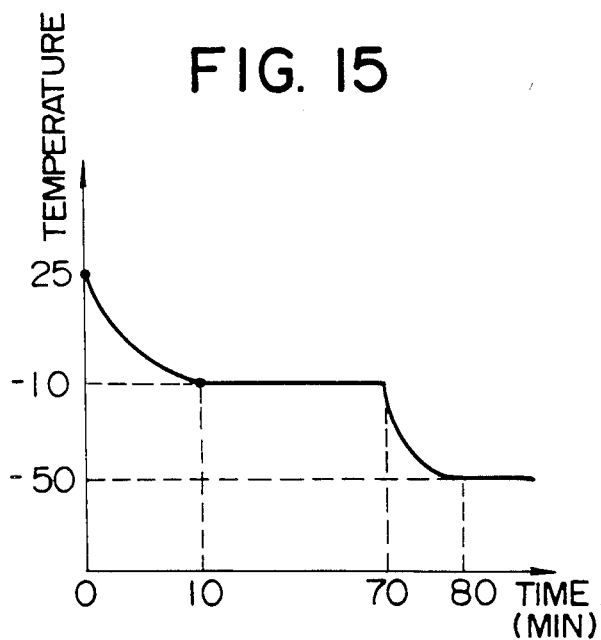
FIG. 15 is a characteristic diagram showing changes with time in the temperature of the refrigerator head in the film forming process of FIG. 14.

FIG. 14 is a construction of an apparatus whereby in producing a substance bonded by van der Waals forces by cooling a material by a refrigerator, by decreasing the temperature of the refrigerator in steps, out of the gases remaining in the vacuum chamber, only components which should not be mixed in the film are first solidified in the first cooling process, then a material substance is introduced to a refrigerator head to form a solidified layer of the material gas. FIG. 15 shows the changes in temperature of the refrigerator head in the process of FIG. 14.

For the material gas for the embodiment shown in FIGS. 14 and 15, titanium tetrachloride, the melting point of which is $-25°$ C., was selected like in the embodiment of FIG. 1.

As shown in FIG. 14, in a vacuum chamber 170, a heater 173 of 0.2 mm enameled wire was connected to a refrigerator head 172 of a gas helium refrigerator of 5 W cooling capacity, utilizing the adiabatic expansion phenomenon of gas helium. The heater 173 was so constructed as to receive power from a heater control power source 174 and heat the refrigerator head 172. On the refrigerator head 172, a chromel-alumel thermocouple 175 is fitted, with which the output power of the heater control power source 174 is controlled, and according to a difference from a fixed refrigerator output, the temperature of the refrigerator head 172 is controlled.

The operating method of this apparatus will now be described.

In a vacuum chamber 170, a refrigerator 171 was operated and a current of 0.2 A was conducted to a heater 173. The temperature of the refrigerator head 172 was changed from normal temperature (25° C.) to $-10°$ C. in ten minutes and held at $-10°$ C. for one hour as shown in FIG. 15.

Figure 16:
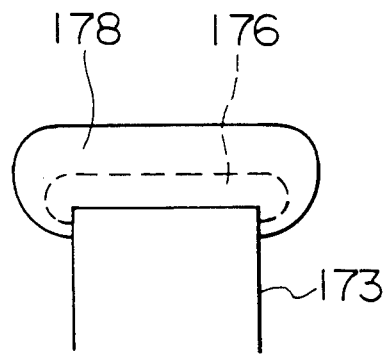
FIG. 16 is a diagram showing a detail of the solidified film on the refrigerator head of FIG. 14.

In this process, residual gas components of water or the like remaining in the vacuum chamber 172 were adsorbed at the surface of the refrigerator head 172 and frozen, thus forming a first solidified layer 176 as shown in FIG. 16.

Then, under the same condition, the refrigerator output was reduced from $-10°$ C. to $-50°$ C. ten minutes later, as shown in FIG. 15, by decreasing the current flowing in the heater to 0.1 A. After this, while the $-50°$ C. was maintained, titanium tetrachloride gas was introduced at the rate of 2 cc/min through a gas introducing port 177, so that a solidified layer 178 of titanium tetrachloride was formed with an 8-mm average thickness around the circumference of the first solidified layer 176.

An argon ion beam 179 with an acceleration energy of 3 keV was applied for ten minutes to the refrigerator head 172 so as to sputter only the thus-formed solidified layer 178 of titanium tetrachloride, thereby forming 500-nm thick metallic titanium film 181 on the substrate 180 in the same manner as in the embodiment described with reference to FIG. 1.

In consequence, the light reflectance of the deposited metallic titanium film was found to be 10% higher than in the embodiment of FIG. 1. Like in the present embodiment, before a material substance is introduced, by decreasing the temperature of the refrigerator head 172 and also the temperature of a cooling panel, which may be provided in the vacuum chamber 170, in order to adsorb or trap the residual gas components of water or the like in the vacuum chamber 170, it is possible to form a film with a reduced amount of the impurity gases mixed in.

Figure 17:
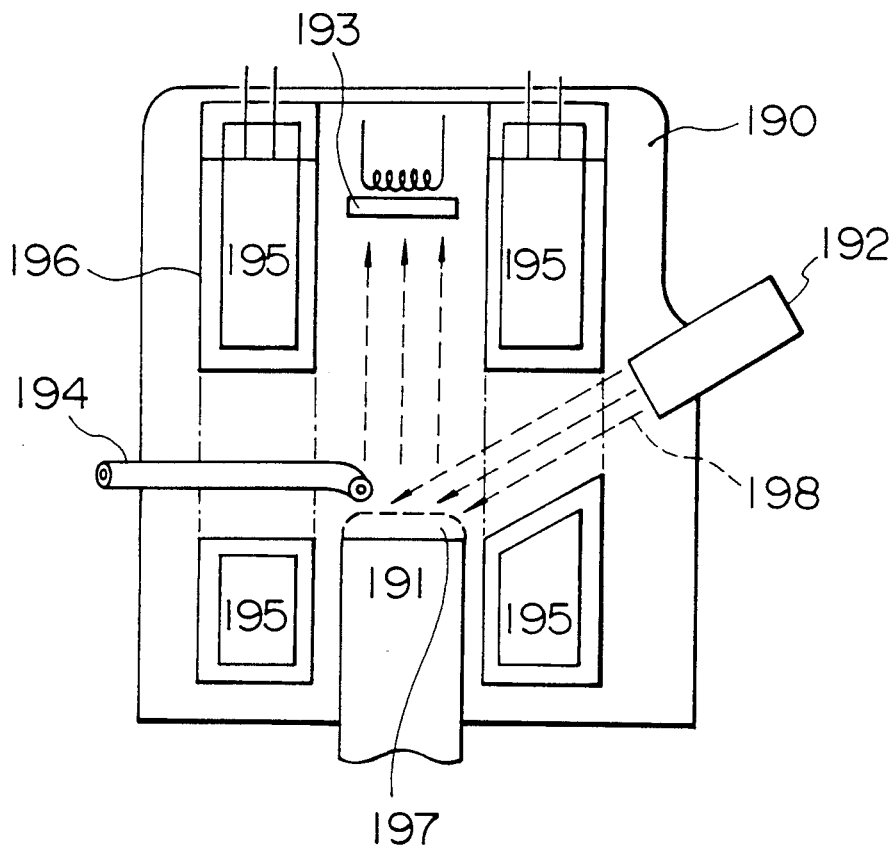
FIG. 17 is a construction of an apparatus in which a cooling panel for adsorbing and trapping a gas evaporated form a solidified substance is installed in a vacuum chamber.

FIG. 17 is a schematic diagram of a film forming apparatus for facilitating the formation of a high-quality film, including in the vacuum chamber a cooling panel to adsorb and trap a gas produced by evaporation of the solidified substance.

In FIG. 17, in a vacuum chamber 190, there are provided a refrigerator head 191, an ion source 192, a heating device-attached substrate 193, and a gas introducing port 194.

Around those parts, there is disposed a cooling trap 196 containing liquid nitrogen 195, the temperature of which is 80K.

Figure 18:
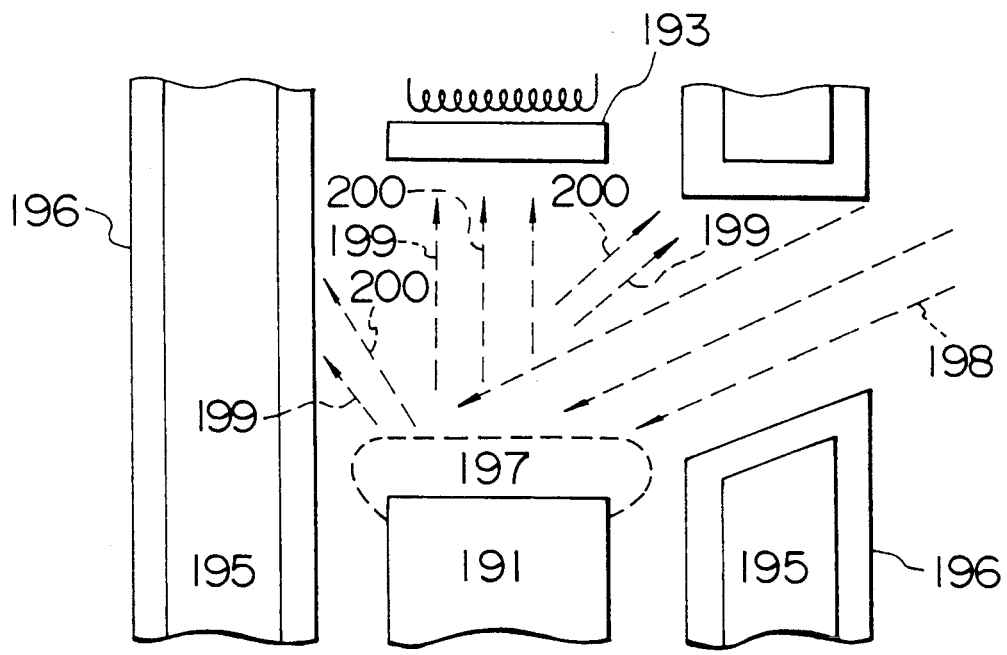
FIG. 18 is a diagram showing a detail of the refrigerator head of FIG. 17.

Consequently, as shown in FIG. 18, a solidified and coagulated layer of a material gas (titanium tetrachloride, for example) produces sputtered particles 199 and evaporated particles 200 scattering in all directions as the solidified layer is struck by an ion beam 198. Those particles that do not reach the substrate 193 are captured again by coagulation and solidification at the surface of the cooling trap 196, and are unable to the substrate 193 any more.

Thanks to the trapping action of the cooling trap 196, it is possible to make it extremely rare for the particles reflected once by the inner wall of the vacuum chamber 190 to reach the surface of the substrate 193. This makes it easy to control the quality of the film formed on the substrate 193.

Figure 19:
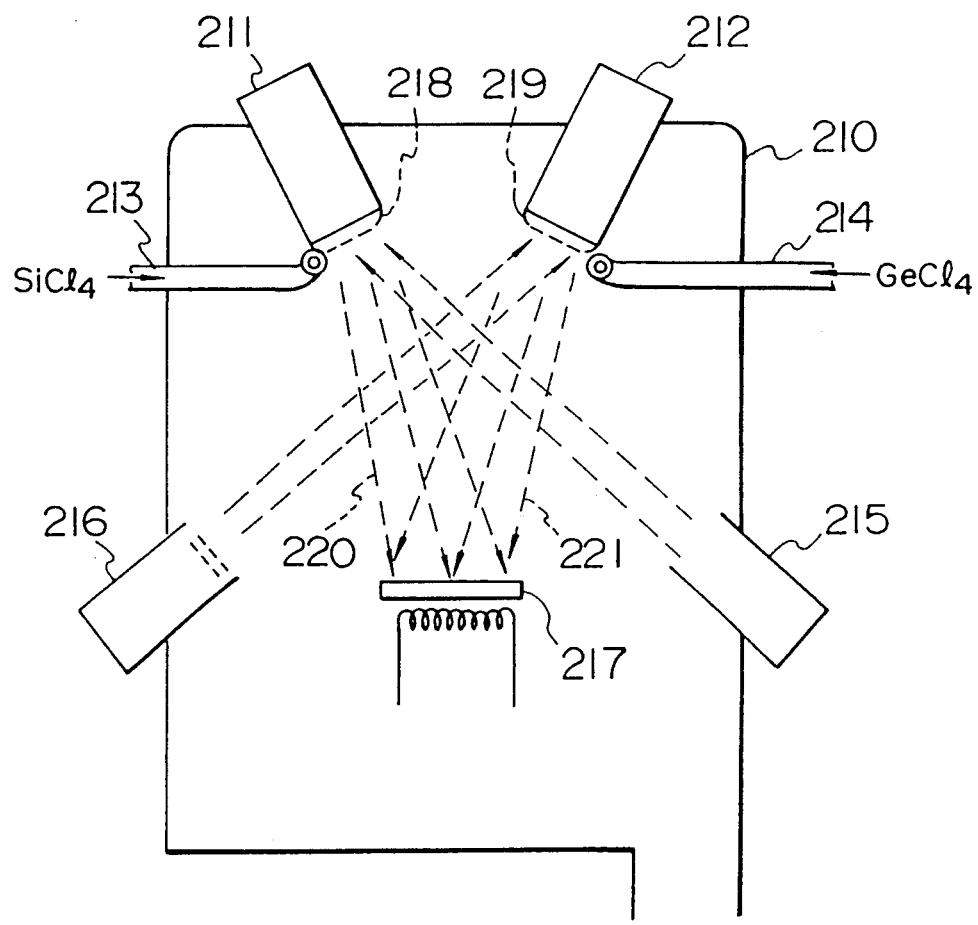
FIG. 19 is a diagram showing a construction of an apparatus for forming a multilayered film.

FIG. 19 shows an example of an apparatus for forming a multilayered film on a substrate 217, comprising two pieces each of refrigerator heads 211, 212, gas introducing ports 213, 214, and ion sources 215, 216.

In FIG. 19, the temperatures of the refrigerator heads 211, 212 were cooled to $-100°$ C., which is below the melting points of silicon tetrachloride (SiCl$_4$) and germanium tetrachloride (GeCl$_4$), these gases were introduced independently of each other through the gas introducing ports 213, 214, and thereby solidified layers 218, 219 of silicon tetrachloride and germanium tetrachloride were formed.

Figure 20A:
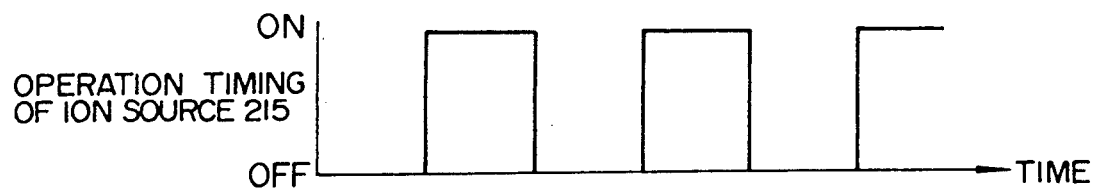
FIG. 20(a), (b) are operation timing diagrams of different ion sources.
Figure 20B:
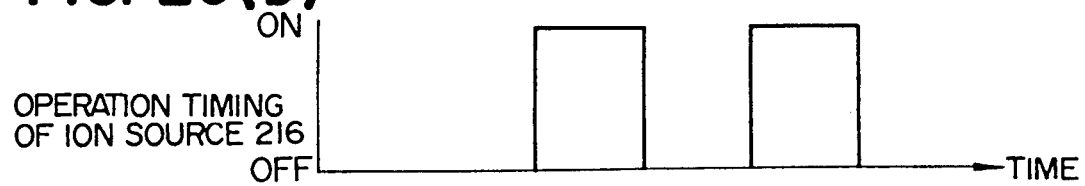

As shown in FIGS. 20(a) and 20(b), the operation times of the ion sources 215, 216 were varied to apply argon ion beams for ten seconds alternately to the solidified layers 218, 219, by which the solidified layers 218, 219 were sputtered intermittently.

As a result, silicon-containing sputtered particles 220 and germanium-containing sputtered particles 221 were deposited alternately, so that ultra-thin laminated layers of Si and Ge, each 5 nm thick, were formed on a glass substrate 217 heated at 200° C.

In this case, the two ion sources 215, 216 were ignited alternately. However, it is possible to keep the ion sources 215, 216 to operate continuously and perform on/off control of voltages for extracting ion beams in a pulse form.

As shown in FIG. 21, it is effective to change, in time sequence, the time for irradiation by an ion beam 226 from a single ion source 225 to strike the solidified layers 218, 219 alternately by switching an electromagnetic scanner 227.

It is easy to continuously control the composition like Si—Si$_x$Ge$_{1-x}$—Ge—Ge$_x$Si$_{1-x}$—Si ($0 \leq x \leq 1$) by having the operation timing of the ion sources 215, overlap each other as shown in FIGS. 22(a) and 22(b).

Next, an example of forming an organic film will be described.

Figure 23:
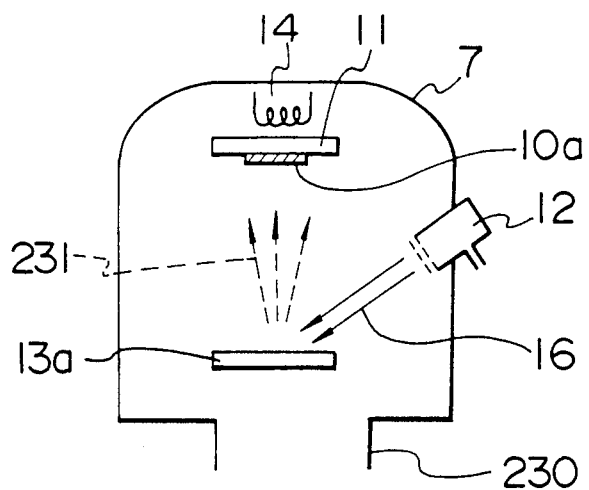
FIGS. 23, 24 and 25 are construction diagrams showing apparatuses used for film formation according to an embodiment of the present invention.

FIG. 23 is a diagram showing a construction of an apparatus for forming a photoresist on a silicon substrate. As shown in FIG. 23, in a vacuum chamber 7, there are arranged a target 13a which is a material substance, a silicon substrate 10a attached to a substrate holder 11, a heater 14 for heating the silicon substrate 10a, and an ion source 12. The vacuum chamber 7 is evacuated to $5 \times 10^{-7}$ by a vacuum pump (not shown) through an exhaust port 230.

By using an apparatus of FIG. 23, a positive type resist was formed which consists phenol novolak resin-naphthoxyn azide photosensitive material. A photosensitive resin composition, comprising 75 wt % of phenol novolak resin (made by Gunei Kagaku, weight-average molecular weight 2000) as an alkali-soluble polymer and 25 wt % of naphthoquinone diazide sulfonyl ester of 2, 3, 4-trihydroxybenzophenon (made by Toyo Gosei Kogyo) was first pulverized to a particle size of about 0.5 to 2 mm, and the pulverized particles were then reduced in a mortar to powder. The powder was pressurized and shaped into a thin, cylindrical form (100 mm diameter, 1 mm thickness).

An argon ion beam 16 having energy of about 6 to 10 eV was generated by the ion source 12 and applied to the target 13a, by which sputtered particles 231 ejected, so that a photoresist film was formed on the 6-in. silicon wafer substrate 10a. The temperature of the substrate 10a was about 60° C. In a film forming time (ion irradiation) of 20 min, a 1.2 μm photoresist film was obtained. The variation in the film thickness, measured by a tracer type film thickness gage, was less than 0.1 μm.

By using a striped pattern mask (stripe width 1 μm, pitch 42 μm) and a Cannon PLA501F (11.0 mW/cm$^2$, 405 nm) as a light source, the photoresist was subjected to exposure for four seconds and was developed with a commercial developer NMD-3 (made by Tokyo Ouka). Then, by using a parallel plates dry etching equipment, the silicon oxide film was etched for five minutes in CHF$_3$ gas under pressure of 10 mTorr and frequency of 13.56 MHz, and the resist film with a commercial stripper S-502 (made by Tokyo Ouka) (strip condition: 140° C., ten min).

For comparison sake, the above-mentioned phenol novolak resin-naphthoquinone diazide photosensitive material was dissolved in ethylcellosolve acetate, and after this photoresist solution was applied to the substrate by spin coating, the resist was subjected to a post bake step (145° C., 20 min), and thus, a resist film was formed. Then, the developing, etching and strip steps were carried out by the same processes as mentioned above.

The above two test specimens were observed under a scanning electron microscope. As a result, it was confirmed that good stripe patterns with a 2 μm pitch, 1 μm width, and 0.5 μm depth were formed on both specimens.

Figure 24:
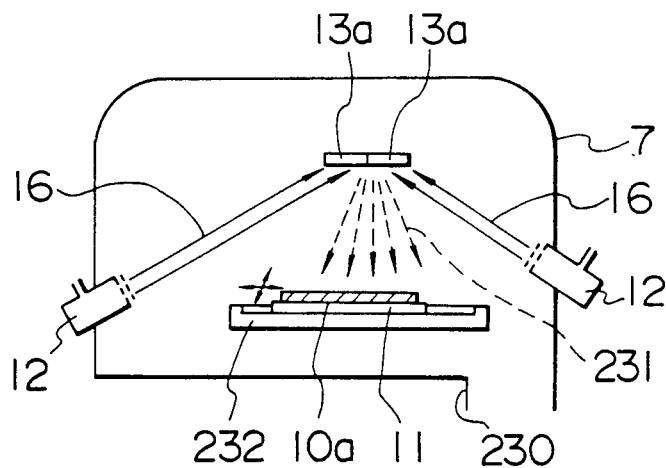

FIG. 24 is a diagram of a construction of an apparatus for forming, on an aluminium plate, a photoresist film identical with the one in the embodiment shown in FIG. 23. As shown in FIG. 24, in a vacuum chamber 7, there are arranged four targets 13a as material substances, a substrate 10a mounted on a substrate holder 11, an X-Y stage 232 movable two-dimensionally, and two ion sources 12. The vacuum chamber 7 is evacuated in the same manner as in the apparatus of FIG. 23.

The size of a piece of target is 150 mm × 150 mm (1 mm thick). The targets were prepared by the same method as in the embodiment of FIG. 23. For the substrate 10a, a surface-polished aluminium plate 500 mm × 500 mm (3 mm thick) was used. Argon ion beams 16 of about 6 to 10 eV, produced by the ion sources 12, were applied to the targets 13a, and the sputtered particles 231 were deposited on the substrate 10a to form a photoresist film thereon. In forming the film, the substrate 10a was moved two-dimensionally by means of the X-Y stage 232. The time required for film formation was about 40 min. In was ascertained that the resist film was substantially uniform with the thickness being 1.3 μm about the center and 1 to 1.2 μm at the four corners of the film.

By using the mask used in the embodiment of FIG. 23, five places, including the four corners and the center, were subjected to exposure, followed by the etching and strop steps. Etching was performed for five minutes in $AlCl_3$ gas under pressure of 5 mTorr by using the same etching equipment as in the embodiment of FIG. 23. The strip step was executed in the same manner as in the embodiment of FIG. 23.

By the observation of the five places at the surface under the scanning electron microscope, it was recognized that the similar stripe pattern as in the embodiment of FIG. 23 was formed.

According to the embodiments described with reference to FIGS. 23 and 24, it is possible to perform patterning in a large area, which is difficult to do by the wet process. Furthermore, the sensitivity of the photoresist and the film forming speed, which have been inferior in the conventional dry process, can be greatly improved. The reasons are that in this invention, owing to the adoption of a low-energy ion beam (particle beam) for sputtering, high-sensitivity resist materials, developed to date, can be used as they are in the dry processes, and that the sputtering yields of targets comprising organic compounds in this invention are far higher than those of inorganic resist materials which have been used conventionally.

By using the apparatus shown in FIG. 23, a polyimide film (insulating film) was formed on a silicon substrate. For the target 13a, 4-aminophthalic anhydride pressurized and formed in a thin cylindrical form was used. For the substrate 10a, a 6-in. silicon wafer heated to 300° C. was used. It ought to be noted that the target 13a was cooled to about room temperature.

Argon ion beams of about 6 to 10 eV were applied to the target 13a to sputter the target, so that a polyimide film was formed on the substrate 10a. By about 25 minutes of film deposition, a polyimide film 1.5 μm thick was obtained. The thus formed polyimide film was tough and does not show brittleness which may result from a decrease in the molecular weight.

It was confirmed by electric resistance measurement that the deposited polyimide film has good insulation property. It was also recognized that the film was free of pinholes, which is difficult to obtain by the wet process.

According to this invention, compounds, including two carboxylic acids, mutually adjacent to an amino group, or their ester compounds, and acid anhydride in one molecule, a typical kind of which is 4-aminophthalic anhydride, can be sputtered, deposited on a substrate and polymerized on that substrate without causing any change in them. It has been considered difficult to form a film of any of those compounds by vacuum evaporation. Therefore, it has become possible to form a polyimide film free of pinholes and excellent in insulation property.

Figure 25:
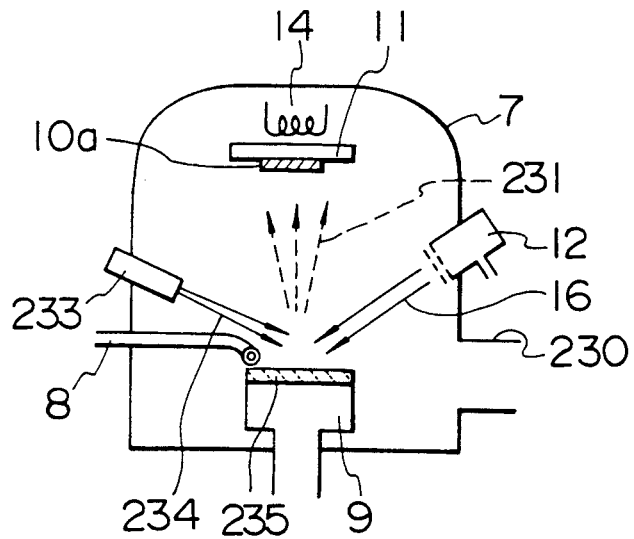

FIG. 25 is a diagram showing a construction of an apparatus for forming a fluorine-containing polymer film on an aluminum substrate. As shown in FIG. 25, in a vacuum chamber 7, there are provided a gas supply pipe 8, a cooling head 9, a substrate 10a attached to a substrate holder 11, a heater 14 for heating the substrate, an ion source 12, and a laser light generator 233. The vacuum chamber 7 is evacuated to about $1 \times 10^{-7}$ Torr by vacuum pump (not shown) through an exhaust port 230. The cooling head 9 can be cooled to the temperature of liquid nitrogen. The laser light generator 233 is a pulse-operated $CO_2$ laser and outputs a maximum of 1 joule.

A film forming operation was performed as follows. A mixed gas of $CHF_3$ and $C_2F_2$ was introduced through the gas supply pipe nozzle 8 onto the cooling head 9 cooled to the temperature of liquid nitrogen, where a solidified layer 235 was formed which was used as the target. An argon ion beam 16 of about 6 to 10 eV generated by an ion source 12 was applied to a solidified layer 235 and also, an infrared laser light 234 of a wavelength of 10.6 μm and as much as 0.5 joule was applied to the solidified layer 235, whereby particles (molecules) were sputtered. Part of the particles 231 are deposited on a mirror-finished 5-in. aluminum substrate (1 mm thick) 10a held at 100° C., thus forming a thin film. A film with a thickness 100 Å was formed for the following evaluation test. The laser light 234 was applied to facilitate the production of radicals. Even if the laser light 234 is not applied, a film can be formed, but in that case, the film forming speed decreases.

The thus formed film was assumed to comprise crosslinked polymers. The ratio of the constituent elements was 34.8% C:12.3% H:52.6% F. The film forming speed was 50 nm/min. The aluminum substrate coated with this fluorine-containing polymer film was subjected to a lubrication performance test by a pin-on-disk wear tester. By using a 30-mm diameter spherical sapphire pin, the surface of the specimen was inspected after 20000 revolutions under the condition of 20 g load and 20 m/s peripheral speed. It was confirmed that the lubricating layer had not been damaged, and it became clear that the this film had an excellent lubricating performance. It was also recognized that this film had good corrosion resistance.

For comparison sake, by using the same mixed gas as in the present embodiment, a film was formed by the plasma polymerization method. The film obtained was found to be crosslinked three-dimensionally, and it exhibited a good lubricating performance, but had susceptibility to corrosion. The film forming speed was about 35 nm/min.

According to this invention, by applying ions with low energy to a solidified layer of a mixed gas of $HCF_3$ and $C_2F_6$, a film of chainlike crosslinked polymers can be formed on the substrate, and this film shows good sliding performance. In addition, the film formation in the present invention ensures better corrosion resistance and higher film forming speed than in the conventional plasma polymerization method which uses the same gas mixture.

In the above description of the film formation by an apparatus shown in FIG. 25, no mention has been made of the conditions of pressure and temperature of the material substance to be used for forming a film. They will now be described in detail.

Figure 26:
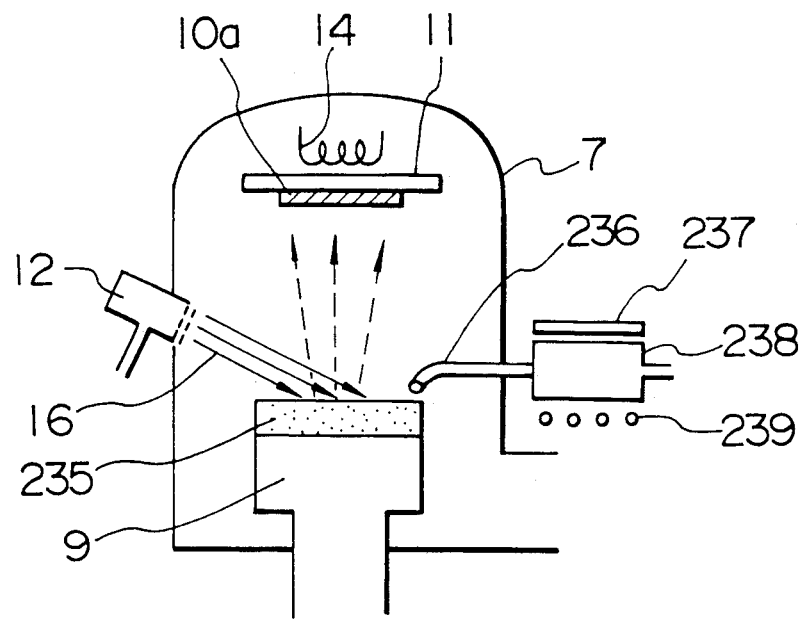
FIGS. 26, 27 and 28 are construction diagrams showing organic film forming apparatuses capable of controlling the pressure and temperature of a material substance.

FIG. 26 is a diagram showing the construction of a film forming apparatus capable of controlling the pressure and temperature of a material substance. As shown in FIG. 26, an ion source 12 is fitted to a vacuum chamber 7, and in the vacuum chamber 7, there are arranged a substrate 10a attached to a substrate holder 11, a cooling head 9 for forming a solidified layer of a material substance thereon, and a material substance introducing pipe 236 for introducing a material substance which is in gaseous or liquid state at normal temperature and pressure. A material substance is supplied into the material substance introducing pipe 236 by a pressure and temperature control section 238. In the pressure and temperature control section, the pressure of the material substance can be controlled by changing its flow rate, and the temperature of the material substance can be controlled by operating a cooling plate 237 and a heater 239.

The apparatus of FIG. 26 operates as follows. A material substance, comprising an organic compound and controlled at predetermined pressure and temperature, is supplied onto the cooling head 9 through the material substance introducing pipe 236. The cooling head 9 is held below the solidifying points of the material substance by a refrigerator (not shown), so that a solidified layer is formed. When an ion beam of about 10 eV produced in the ion source 12 is applied to the solidified layer 235, particles are sputtered from the solidified layer 235, thus depositing a film of an organic compound on the substrate 10a held at a predetermined temperature.

If the material substance is a gas, the pressure and temperature control section 238 controls the supply (blowout) speed of the gas so as to be less than sonic velocity. If the gas gushes out at a velocity faster than sonic velocity, shock waves occur inside the vacuum chamber 7, producing unfavorable effects on the formation of a film. It became clear that when the gas blowout speed is slower than sonic velocity, the faster the speed, the more quickly the solidified layer 235 is formed. Therefore, in forming a film, it is desirable to set the optimal gas blowout speed to allow compensation—neither excessive nor insufficient—for the decrease in the solidified layer 235 due to sputtering.

Generally, it is better to minimize the difference in temperature between the material substance and the cooling head in order to lessen the effect of the temperature change of the organic compound, which will result in a change in the chemical composition. When a material substance in gaseous state is used, from experience with a certain range of material substances used to date for film formation, a good film can be formed by raising the temperature of a material substance 5° to 10° C. higher than its boiling point and by lowering the material substance temperature 5° to 10° C. lower than its melting point.

As a concrete example of material substance, a case in which tetrafluoroethylene ($CF_2=CF_2$) was used will be described. When the temperature of a material substance is $-70°$ C. and the temperature of the cooling head 9 is $-150°$ C., a material substance, the melting point of which is $-142.5°$ C., forms a solidified layer 235. By applying an argon ion beam 16 of about 6 to 10 eV to the solidified layer 235 to sputter particles therefrom, a film was formed on the aluminum substrate a held at 100° C. By investigating the constituent element ratio of the deposited film, it was clarified that the film comprised polytetrafluorethylene $-CF_2-CF_2-_n$, and that there was no disorder in the chemical composition, which occurred when a film was formed when the temperature of the material substance is room temperature.

Figure 27:
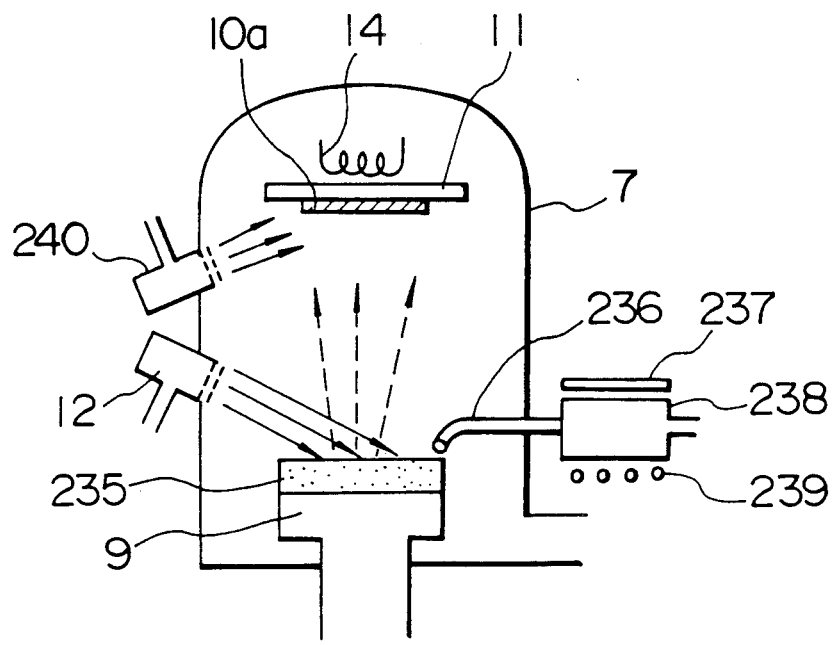

FIG. 27 is a modification of the film forming apparatus capable of controlling the pressure and temperature of a material substance. This apparatus is the same as the one shown in FIG. 26, excepting that there is further provided an ion source 240 for irradiation of the substrate 10a. By using the apparatus of FIG. 27 and tetrafluoroethylene as the material substance, a film was formed on the aluminum substrate 10a. It was confirmed that the film was polytetrafluoroethylene with less disorder in the chemical composition like the film formed by the apparatus of FIG. 26. Since an argon ion beam 10a of about 5 eV produced in the ion source 240 was applied to the substrate 10a, it became clear that the deposited film was more dense and had better adherence to the substrate 10a than the film formed by the apparatus of FIG. 26.

Figure 28:
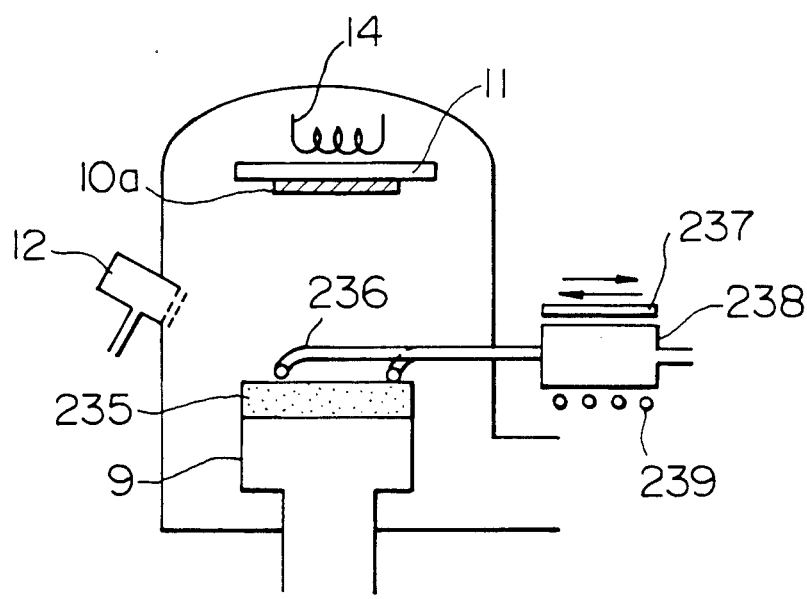
Figure 29A:
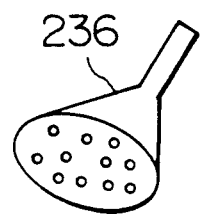
FIGS. 29A, 29B and 29C are construction diagrams of the material substance blowout outlet of the apparatuses of FIGS. 26 through 28.
Figure 29B:
Figure 29C:
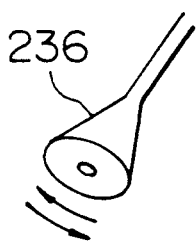

FIG. 28 is another modification of the film forming apparatus capable of controlling the pressure and temperature of a material substance. The apparatus in FIG. 28 is almost identical with the one of FIG. 26, with only the exception that the material substance introducing pipe 236 is adapted to be movable above the cooling head 9. By using this apparatus, the solidified layer can be formed with uniform thickness and the thickness distribution of the film formed by sputtering on the substrate 10a can be made uniform. FIGS. 29A, 29B and 29C show a modification of the material substance blowout nozzle of the material substance introducing pipe 236. FIG. 29A shows the nozzle having many holes, FIG. 29B shows the nozzle widened in a taper form to supply the material in a wide range, and FIG. 29C shows the nozzle which has one or more holes and can pivot. By using an apparatus having any of these nozzles for forming a film, the thickness of the deposited film can be made more uniform.

As described above, it was confirmed that by the use of the apparatus of FIG. 25, an organic film having good lubricating performance can be formed.

To apply this film forming method to an actual manufacturing process, however, it is necessary to develop an apparatus for forming a uniform film over a large area. A large-ares film forming apparatus will be described in the following.

Figure 30:
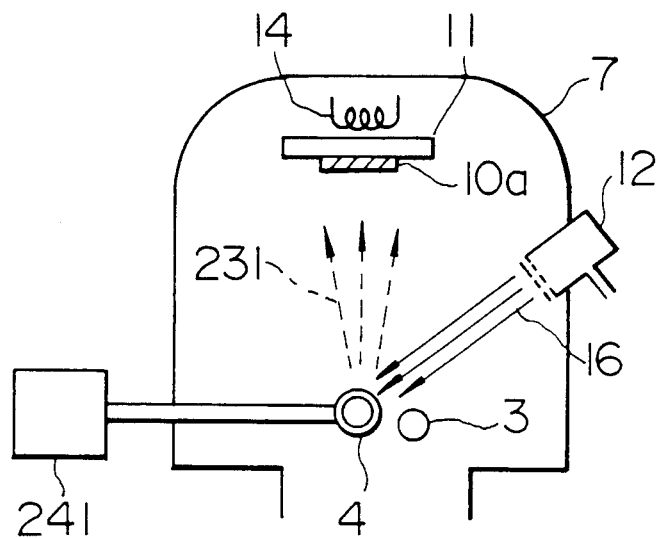
FIG. 30 is a construction diagram of a large-area organic film forming apparatus according to an embodiment of the present invention.
Figure 31:
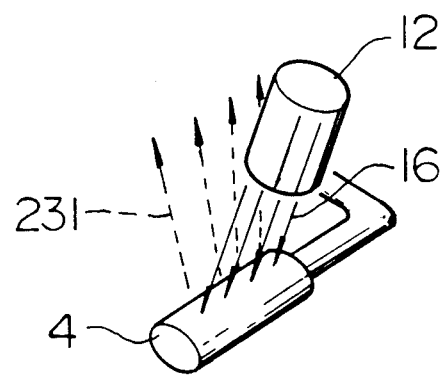
FIG. 31 is a diagram for explaining the operation of FIG. 30.

With reference to FIGS. 30 and 31, the construction and operation of a large-area film forming apparatus will be described. As shown in FIG. 30, in a vacuum chamber 7, there are arranged an ion source 12, an introducing pipe 3 for introducing into a vacuum a material substance in gaseous or liquid state at normal temperature and pressure, a cooling head 4, a filament 14 for heating a substrate, a substrate holder 11, and a substrate 10a. The material substance introducing pipe 3 in a pipe for has a plurality of holes bored at least in a row in the axial direction at the surface of the pipe. The substrate 10a is a rectangular prism (thin in thickness) long in a direction perpendicular to the surface of the paper on which there is FIG. 30. As shown in FIG. 31, the cooling head 4 has a cylindrical form, and it can be cooled to about the temperature of liquid nitrogen and is rotatable about its axis. The vacuum chamber 7 is evacuated to $1\times10^{-7}$ Torr by a vacuum pump (not shown).

For example, a mixed gas of $HCF_3$ and $C_2F_6$ is introduced into a vacuum through the material substance introducing pipe 3, and a solidified layer of the mixed gas is formed on the surface of the cooling head 4. An argon ion beam 16 with energy of about 6 to 10 eV is applied to the solidified layer, and sputtered particles 231 are deposited on the aluminum substrate 10a to form an organic film. In this film forming process, though this is not illustrated, if a $CO_2$ laser light is applied to near the above-mentioned solidified layer to promote the production of radicals, the film forming speed can be improved. By using the apparatus of FIG. 30, a film can be formed on a large-area substrate long either in the vertical or horizontal side.

Figure 32:
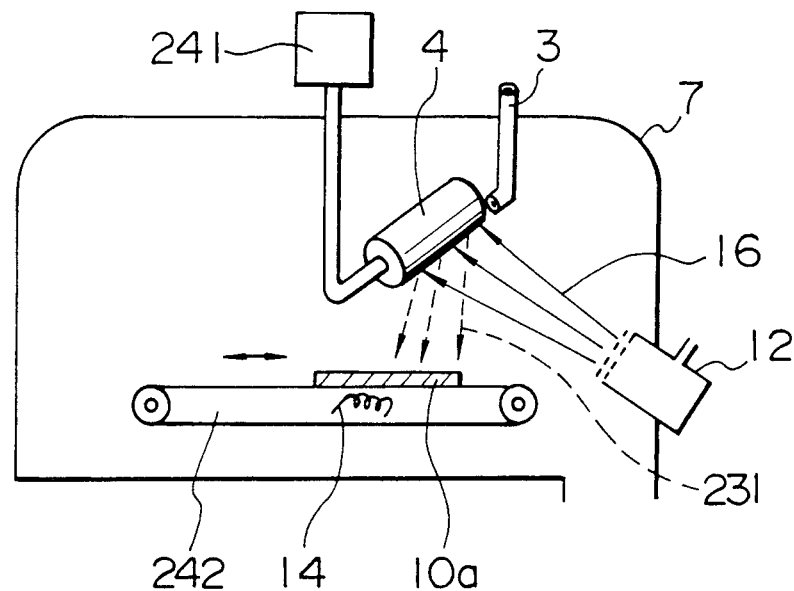
FIGS. 32, 33 are arrangement diagrams showing a large-area organic film forming apparatus according to another embodiment of the present invention.

Another example of the large-area film forming apparatus will be described with reference to FIG. 32. In this apparatus, there are provided an ion source 12, a material introducing pipe 3, a cooling head 4, and a filament 14 for heating. This arrangement of the parts is the same as in the apparatus of FIG. 30, but only difference is that a substrate 10a has a large area in a generally square shape and is movable in the arrow direction by a substrate feed mechanism 242.

In forming a film by this apparatus, a solidified layer of a material substance introduced into a vacuum through the material supply pipe 3 is formed on the surface of the cooling head 4, particles are sputtered by an ion beam from the ion source 12 to form a film on the substrate 10a. This operation is the same as that by the apparatus of FIG. 30. However, in the case of FIG. 32, a film is formed while the substrate 10a is moved in the direction of the arrows, making it possible to form an organic film substantially uniform in quality and thickness even on a large-area substrate on which a square film is to be deposited. In addition, since the cooling head 4 is rotated, the region in which a solidified layer of material substance is formed can be separated from the region to which an ion beam 16 is applied, so that large quantities of ion beam can be applied and the film forming speed can be increased, accordingly.

Figure 33:
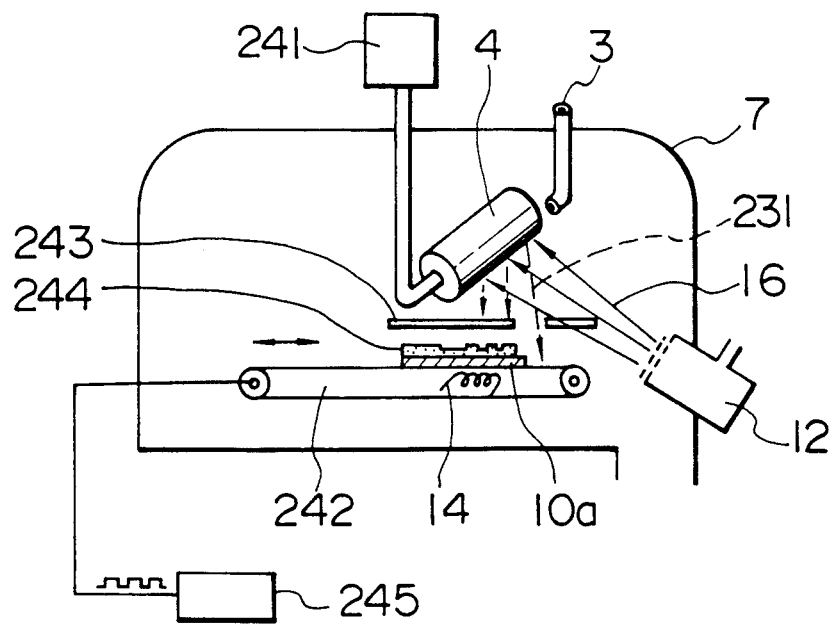

Yet another example of the large-area film forming apparatus will be described with reference to FIG. 33. In the case of this apparatus, in a vacuum chamber 7, there are provided an ion source 12, a material introducing pipe 3, a cooling head 4, a filament 14 for heating, a substrate 10a, and a substrate feed mechanism 242. This arrangement of the parts is the same as in the apparatus in FIG. 32, but only difference is that there are further provided a slit 243 for shaping the sputtered particles and a speed control circuit 245 for changing the feed (moving) speed of the substrate.

Also in the film deposition by this apparatus, an ion beam 16 is applied to a solidified layer of material substance formed on the surface of the cooling head 4, and a film is formed by depositing sputtered particles 231 by moving the substrate 10a. This film forming operation is the same as in the apparatus of FIG. 32. However, in this embodiment, the thickness of the film deposited on the substrate 10a can be set arbitrarily by controlling the substrate feed speed by the speed control circuit 245 and using the slit 243. Furthermore, it is possible to selectively form a film only in a specified region on the substrate 10a. These features are useful particularly in the fabrication process of thin film transistors for display units.

In the foregoing embodiments, ion beams were used for irradiation of the substrate formed on the surface of a target or a cooling head, but other particle beams such as a neutral particle beam or a plasma may be used. The same effect can be achieved by using the types of particles other than those of argon. The film forming speed differs with the kinds of particles.

Meanwhile, as a means for generating a particle beam with very low energy of less than 50 eV, such a method is often used as drawing out charged particles with high energy form a plasma source, and then decelerating the particles to obtain a particle beam (normally, an ion beam) with low energy. However, in this method, an electrostatic lens is used to suppress the divergence of the particle beam during deceleration, and when the particle beam is drawn out for a large area, the converging effect is reduced, making it difficult to obtain a particle beam for a large area. As a countermeasure for this, in this invention, a particle beam generator, which utilizes a sputtering phenomenon, is used. As particles of a particle beam for use in irradiation of the target or solidified layer of a material substance, it is desirable to use those which are gaseous at normal temperature in order to minimize the particles captured in the film deposited on the target or the substrate. With a particle beam generator according to this invention, a material gas for a particle beam is supplied onto the cooling plate disposed in a vacuum, the supplied gas is solidified on the cooling plate, and the solidified layer is struck by rare gas ions with several kilovolts. The particles sputtered by this ion irradiation are taken out in the form of a beam.

Figure 34:
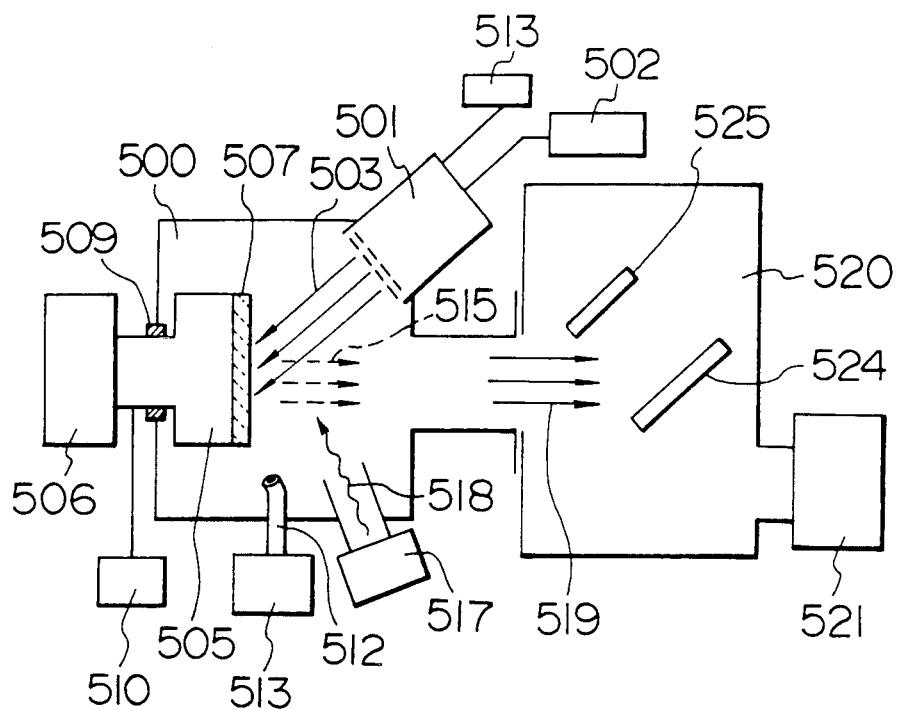
FIG. 34 is a construction diagram showing a partical beam generator used in embodiments of the present invention.

The construction and operation of the particle generator will be described with reference to FIG. 34. As shown in FIG. 34, the particle generator comprises a vacuum chamber 500, a cooling plate 505 disposed in the vacuum chamber 500 or adjacent thereto, maintaining airtightness, a gas supply pipe 512, an ion source 501, and an electron beam generator 517. The ion source 501 receives a gas from the gas supply unit 513 and is controlled by a power source 502. The cooling plate is cooled by a refrigerator 506 and electrically insulated by an insulator 509 from the vacuum chamber 500, and has a DC bias applied thereto from a bias source 501. A material gas is supplied from the gas supply unit 513 to the gas supply pipe 512.

The above-mentioned particle generator is connected airtightly to a film forming chamber 520 including a target 524 and a substrate 525, and a vacuum pump 521. The vacuum chamber 500 and the film forming chamber 520 are evacuated to about $1 \times 10^{-6}$ Torr. With the cooling plate cooled to about the temperature of liquid nitrogen (less than $-196°$ C.), argon gas is supplied through the gas supply pipe 512, and the argon adheres to the cooling plate 505 and is solidified. When an argon ion beam of 3 keV generated by the ion source 501 is applied to the solidified layer of argon gas 507, argon particles 515 are sputtered. By applying an electron beam 518 to the sputtered particles 515, many sputtered particles are ionized. The sputtered particles spread radially, and those particles, which fly in a direction substantially perpendicular to the surface of the cooling plate 505, are taken out as an ion beam 519 from the particle generator.

Figure 35:
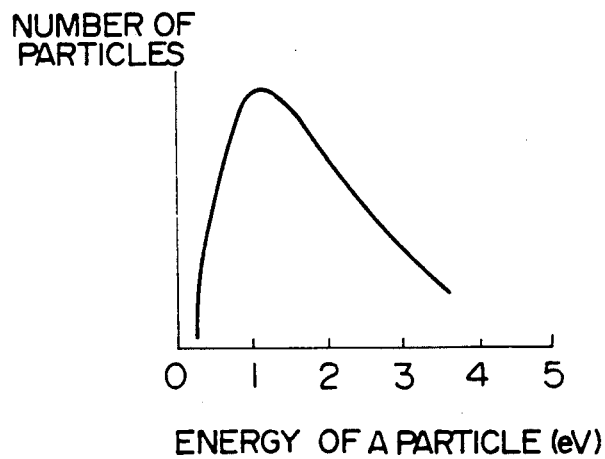
FIGS. 35, 36 are characteristic diagrams of the apparatus of FIG. 34.
Figure 36:
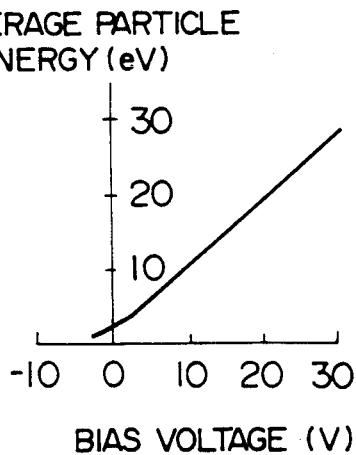

FIG. 35 shows an energy distribution of argon particles (ions in the ion beam 519), as measured by an electrostatic energy analyzer. It ought to be noted that the cooling plate 505 is grounded. The measurement results show that the energy of an argon particle is about 1 eV in most cases, and that the half-value width of the energy distribution is a few electron volts. FIG. 36 shows the relation between the bias voltage and the average energy of an argon particle, obtained by changing the bias potential of the cooling plate 505 and measuring the energy distribution of the argon particles. It will be understood that an argon ion beam of about 10 eV can be obtained when the bias voltage is about 8.5 V.

The ion beam 519 of about 10 eV is applied to the target 524, and a film is formed on the substrate 525. Incidentally, in addition to film formation, the particle beam generator described above can be used for etching of semiconductors, for example, since this particle beam generator is capable of generating chlorine gas of low energy by using chlorine gas instead of argon gas. This particle beam generator has advantages that because a grid is not used to draw out an ion beam, the quantity of dirt in the processing room where etching is performed is little, and that since the energy of the ion beam is low, damage to workpieces processed is reduced.

Figure 37:
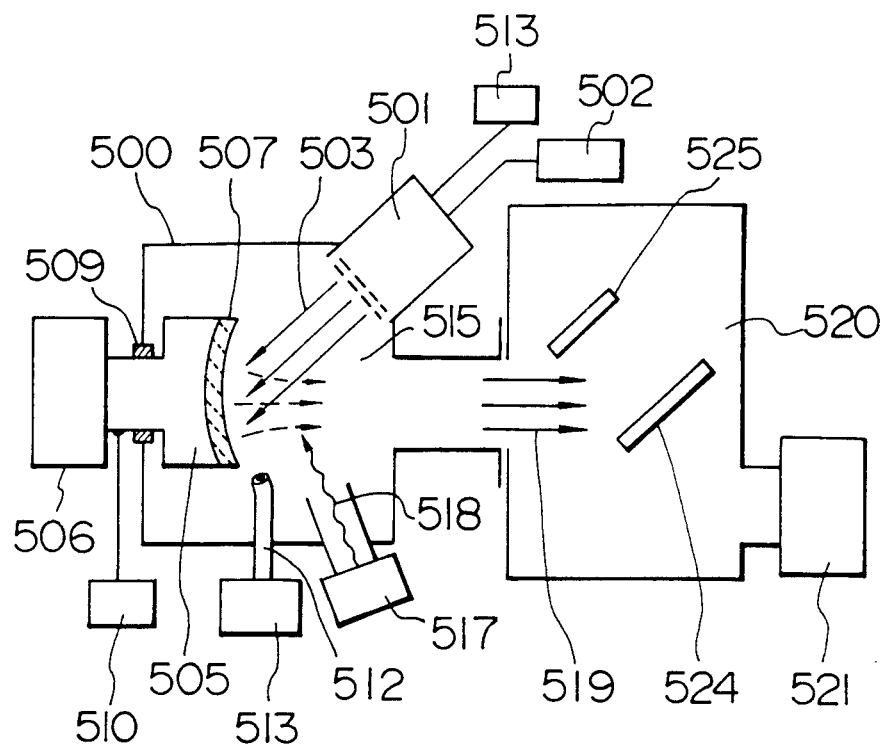
FIGS. 37, 38 are construction diagrams of other particle beam generators used in embodiments of the present invention.

Description will next be made of a modification of the apparatus described referring to FIG. 34. The apparatus in FIG. 37 is the same as that in FIG. 34, with the exception that the cooling plate 505 has a concave surface. The apparatus of FIG. 37 is superior to the apparatus of FIG. 34 in that the sputtered particles emitted from the solidified gas 507 can be efficiently formed into an ion beam 519. Though, in the apparatus of FIG. 34, the electron beam 518 is used to ionize the sputtered particles 515, a laser beam may be used, instead.

Figure 38:
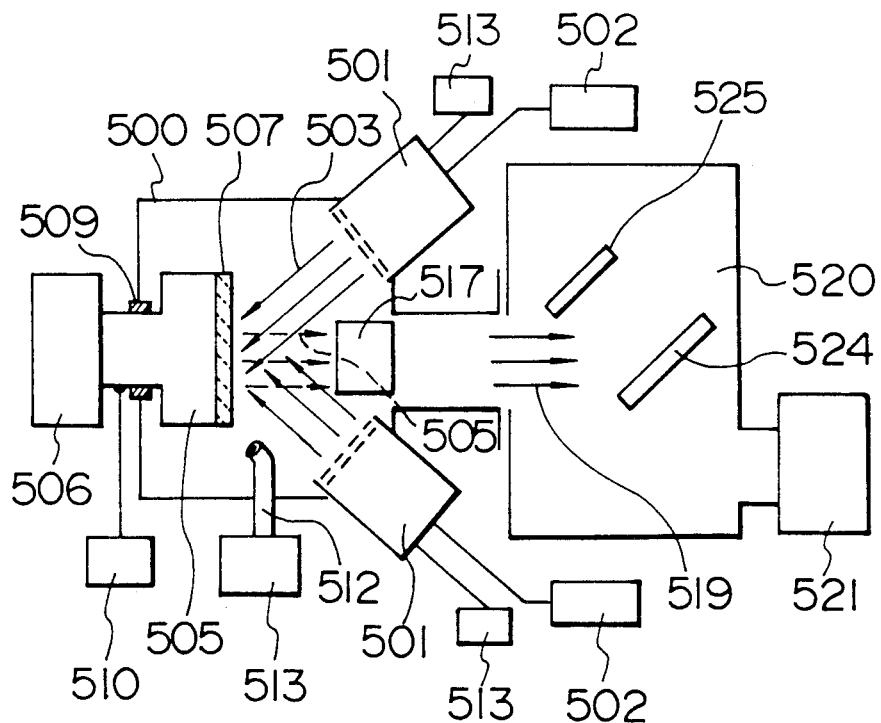

Referring to a still further modification, an apparatus of FIG. 38 is the same as the apparatus of FIG. 34, with the exception that two ion sources are used for ion irradiation of the solidified gas 507. The quantity of the ion beam 519 that can be produced by the apparatus of FIG. 38 is about twice as much as that by the apparatus of FIG. 34. In order to further increase the quantity of the ion beam, it is possible to increase the number of ion sources.

According to the present invention described above, a particle beam such as an ion beam, an electron beam, or a plasma is applied to a sputtering target comprising a substance made by bonding atoms or molecules by van der Waals forces or hydrogen bonding force in a vacuum, the particles thereby sputtered from the target fly in the space in the vacuum chamber, reach the substrate, and are deposited to form a film thereon. Therefore, a substance of a condensed gas, bonded by weak bonding energy, such as van der Waals forces or hydrogen bonding force is decomposed and sputtered at high speed by ions or a plasma, so that a film of high purity and quality can be formed at high speed.

Another effect of this invention is that by directing sputtered particles by sputtering a target comprising a substance described above, a desired substrate of a metal, dielectric, organic substance or semiconductor can be processed efficiently.

A further effect of the present invention is as follows. Owing to irradiation of a target comprising an organic compound by a particle beam of about 10 eV or less, in the target substance, the molecular crystalline bonds are broken, but the nonmolelcular crystalline bonds are not broken, and the sputtered particles are deposited on the substrate to form an organic film. Therefore, an organic film thus formed is free of pinholes, impurities and disorder in the molecular composition and arrangement. An additional effect is that it is easy to prepare a large-size target, arrange to make the substrate movable during the film forming process, and increase the dosage of the particle beam, and therefore, a large-area organic film can be deposited on the substrate at higher speed than in the prior-art methods.

We claim:

1. A method of forming a film, comprising the steps of:
    applying a particle beam to a material substance bonded by either van der Waals forces or hydrogen bonding forces, so as to sputter particles from said material substance, thereby producing particles from the material substance by sputtering;
    applying the particles produced by sputtering of said material substance to a substrate; and
    forming a film, including at least the particles produced by the sputtering, on said substrate.

2. The method according to claim 1, wherein at least a part of the particles produced by said sputtering are ionized to ions by electron impact or laser light means, and wherein a film is formed by including at least a part of the ions or applying both the ions and said sputtered particles to a substrate.

3. The method according to claim 1, further comprising the step of controlling an external shape of the material substance bonded by either van der Waals forces or hydrogen bonding forces by applying a laser light to a region of the material substance and by partially evaporating said material substance of the region to which the laser light was applied.

4. The method according to claim 1, wherein the particle beam is applied to the material substance, and the particles produced by sputtering are applied to the substrate, in a vacuum.

5. A method for forming a film, comprising the steps of:
    having a material substance adsorbed on a target held at a temperature below the melting point of the material substance, said material substance being bonded, as adsorbed on the target, by van der Waals forces or hydrogen bonding forces;
    sputtering said material substance bonded by either van der Waals forces or hydrogen bonding forces by applying a particle beam thereto, so as to form sputtered particles; and
    applying the sputtered particles produced by said sputtering to a substrate to form a film thereon.

6. The method according to claim 5, wherein at least a part of the particles produced by said sputtering are ionized to ions by electron impact or laser light means, and wherein a film is formed by including at least a part of the ions or applying both the ions and said sputtered particles to the substrate.

7. The method according to claim 5, wherein the sputtering, and the applying the sputtered particles to the substrate, are performed in a vacuum.

8. A method for forming a film in a space having a vacuum therein, comprising the steps of:
    introducing a material substance for a film into the space having the vacuum;
    solidifying said material substance in the space, by having it come into contact with and adsorbed on the surface of a target cooled to below the melting point of the material substance, so as to form solidified material substance on the target, the solidified material substance being bonded by van der Waals forces or hydrogen bonding forces;
    sputtering with an ion beam the solidified material substance;
    forming on the substrate a film including at least a part of said material substance therein by applying sputtered particles produced by said sputtering to said substrate.

9. The method according to claim 8, wherein the sputtering, and the applying the sputtered particles to the substrate, are performed in a vacuum.

10. A method for forming a film in a vacuum chamber, comprising the steps of:
    solidifying a material substance for a film, by cooling said materials substance to below its melting point in a place separate from a vacuum chamber in which the film is formed, so as to form a solidified material substance, the solidified material substance being bonded by van der Waals forces or hydrogen bonding forces;

introducing said solidified material substance into said vacuum chamber, into a vacuum;

sputtering the solidified material substance introduced into the vacuum by an ion beam; and applying sputtered particles produced by said sputtering to a substrate to form on said substrate a film including at least a part of said material substance.

11. A method for forming a film, comprising the steps of:

introducing into a vacuum at least two kinds of material substance for a film;

preparing a cooling target cooled in the vacuum, cooled to a temperature lower than the melting point of any of the material substances introduced into the vacuum;

bringing said material substances into contact with the surface of said cooling target, held at the temperature lower than the melting point of any of the material substances introduced into the vacuum, to form a solidified layer of a mixture of said at least two kinds of said material substance, the solidified layer being bonded by van der Waals forces or hydrogen bonding forces;

sputtering particles from said solidified layer by applying a particle beam to said solidified layer; and applying said sputtered particles to a substrate in the vacuum, to form a film thereon.

12. The method according to claim 1, 5, 8, 10 or 11, further comprising the step of accelerating the film forming process on the surface of said substrate by heating, or by applying another exciting beam selected from the group consisting of an ion beam, electron beam, radicals or light.

13. A method for forming a film, comprising the steps of:

applying a particle beam to at least two material substances each bonded by either van der Waals forces or hydrogen bonding forces, the at least two material substances respectively being provided at at least two places to provide, respectively, at least two places respectively for generating sputtered particles from said at least two material substances by sputtering;

simultaneously or intermittently controlling the time for sputtering at the at least two places to generate sputtered particles at the at least two places; and forming on a substrate a film comprising the at least two material substances or a multilayered film respectively containing at least one material substance of the at least two material substances.

14. The method according to claim 13, wherein the particle beam is applied to the at least two material substances, and the film is formed on the substrate, in a vacuum.

15. A method for forming a film, comprising the steps of:

introducing at least two material substances for a film into a chamber;

solidifying said at least two material substances in the chamber, by having the at least two material substances come into contact with and be adsorbed on a surface of a target cooled to below the melting point of the at least two material substances, the at least two material substances, as solidified, each being bonded by either van der Waal forces or hydrogen bonding forces, the at least two material substances respectively being provided at at least two places;

sputtering with at least one ion beam the at least two material substances, solidified on said target at at least two places, to provide at least two places respectively for generating sputtering particles from said at least two material substances by sputtering;

simultaneously or intermittently controlling the time for sputtering at the at least two places to generate sputtered particles at the at least two places; and forming on a substrate a film comprising the at least two material substances or a multilayered film respectively containing at least one material substance of the at least two material substances.

16. The method according to claim 15, wherein the solidified material substances are sputtered by an ion beam, and the film is formed on the substrate, in a vacuum.

17. A method for processing a substrate, comprising the steps of:

applying a particle beam to a substance bonded by van der Waals forces, so as to sputter particles from said substance, thereby forming sputtered particles from said substance; and applying the sputtered particles, generated by sputtering of said substance, to a substrate material selected from the group consisting of a metal, dielectric, organic substance and semiconductor, to process said substrate.

18. The method according to claim 17, wherein the particle beam is applied to the substance, and the sputtered particles are applied to the substrate material, in a vacuum.

19. An apparatus for forming a film, comprising:

a vacuum chamber;

material substance introducing means for introducing into said vacuum chamber a material substance for a film, which is in gaseous or liquid state;

a target, held at a temperature below the melting point of the material substance introduced by said material substance introducing means, for forming on the surface of the target a layer, bonded by either van der Waals forces or hydrogen bonding forces, of said introduced substance;

a particle beam source for applying a particle beam to said layer bonded by either van der Waals forces or hydrogen bonding forces to sputter said layer; and a substrate to which the particles, sputtered by a sputtering action by a particle beam from said particle beam source, are applied to form on the surface thereof a film including at least a part of said material substance.

20. An apparatus for forming a film, comprising:

a vacuum chamber;

material substance introducing means for introducing into said vacuum chamber a material substance for a film;

a target, cooled to below the melting point of the material substances to be introduced by the material substance introducing means, for adsorbing on the surface thereof a gas or a liquid substance introduced by said material substance introducing means, so as to form on the surface thereof material substance bonded by van der Waals forces or hydrogen bonding forces;

a charged particle source for applying charged particles to said target for sputtering said material substance, bonded by van der Waals forces or hydrogen bonding forces, on the target; and a substrate to which particles sputtered by charged particles from said charged particle source are applied to form a film on the surface thereof.

21. An apparatus for forming a film, comprising:
a vacuum chamber;
material substance introducing means for introducing into said vacuum chamber a material substance for a film, which is in gaseous or liquid state;
a target, held at a temperature below the melting point of the material substance introduced by said material substance introducing means, for forming on the surface thereof a layer, bonded by van der Waals forces or hydrogen bonding forces, of the introduced material substance;
an ion source for applying an ion beam to said layer bonded by either van der Waals forces or hydrogen bonding forces to sputter said layer; and
a substrate to which particles sputtered by a sputtering action by an ion beam from said ion source, are applied to form on the surface thereof a film including at least a part of said material substance.

22. An apparatus for forming a film, comprising:
a vacuum chamber;
at least two material substance introducing means for separately introducing at least two material substances for a film into said vacuum chamber;
at least two targets, respectively held at temperatures below the melting points of the at least two material substances introduced separately by said at least two material substance introducing means, for forming on the surface of each target a layer of a respective introduced material substance, the layer being bonded by either van der Waals forces or hydrogen bonding forces;
at least two particle beam sources for simultaneously or intermittently applying particle beams to the layers, bonded by either van der Waals forces or hydrogen bonding forces, on said at least two targets, for sputtering particles from the layers; and
a substrate on which a multi-element film or a multi-layered film is formed of particles which are sputtered from said at least two targets, when particle beams from said at least two particle beam sources are applied to the targets simultaneously or intermittently.

23. The apparatus according to claim 19, 20, 21 or 22, further comprising a heating device for heating said substrate to accelerate the film forming process at the surface of said substrate.

24. The apparatus according to claim 19, 20, 21, or 22, further comprising exciting beam irradiation means for applying an exciting beam, selected from the group consisting of an ion beam, electron beam, radicals, and light, to accelerate the film forming process at the surface of said substrate.

25. The apparatus according to claim 19, 20, 21, or 22, further comprising a cooling panel, provided in said vacuum chamber, which is at a temperature lower than a temperature of a target for forming a layer bonded by either van der Waals forces or hydrogen bonding forces or a solidified layer and which is used to adsorb and trap a gas unnecessarily evaporating from a layer of material substance.

26. The apparatus according to claim 19, 20, 21, or 22, further comprising means for rotating or linearly reciprocating a cooler head for uniformly producing the layer bonded by either van der Waals forces or hydrogen bonding forces.

27. The apparatus according to claim 19, 20, 21, or 22, further comprising in said vacuum chamber a molecular beam evaporation device, a vacuum evaporation device, or an ionized cluster beam evaporation device for vapor-depositing a desired substance on said substrate.

28. A method for forming a film comprising the steps of:
generating sputtered particles by sputtering of a material substance bonded by either van der Waals forces or hydrogen bonding forces by applying a particle beam to said material substance;
simultaneously and continuously supplying said material substance from outside; and
applying to a substrate said sputtered particles while maintaining the quantity of said material substance bonded by either said van der Waals forces or hydrogen bonding forces at a fixed level at all times to form on said substrate a film including at least a part of said material substance.

29. The method according to claim 28, wherein the sputtered particles are generated, and applied to the substrate, in a vacuum.

30. A processing apparatus, comprising:
a vacuum chamber;
introducing means for introducing into said vacuum chamber a substance, which is in a gaseous or liquid state;
a target, held at a temperature lower than the melting point of the substance introduced by said introducing means, for forming on the surface thereof a solidified layer of said introduced substance, the solidified layer of the introduced substance being bonded by either van der Waals forces or hydrogen bonding forces;
a particle beam source for applying a particle beam to the solidified layer of said target for sputtering particles of the solidified layer bonded by either van der Waals forces or hydrogen bonding forces; and
a substrate material, selected from the group consisting of a metal, dielectric, organic substance, and semiconductor, which is processed by application thereto of sputtered particles produced by sputtering of said solidified layer which occurs when a particle beam is applied to said solidified layer from said particle beam source.

31. A method for forming a film in a vacuum, chamber, comprising the steps of:
applying to a target of an organic compound a particle beam having a level of energy sufficient to break molecular crystalline bonds and not sufficient to break nonmolecular crystalline bonds of the organic compound, so as to sputter particles of the organic compound, the molecular crystalline bonds being bonds by van der Waals forces connecting the atoms constituting the organic compound and the nonmolecular crystalline bonds being bonds by other than van der Waals forces, so as to form sputtered particles from the target; and
depositing sputtered particles of said target on the surface of a substrate to form a film thereon.

32. A method for forming a film in a vacuum chamber, comprising the steps of:

putting a target comprising an organic compound having molecular and nonmolecular crystalline bonds in the chamber;

applying a particle beam with energy of about 10 eV or less to said target comprising said organic compound, so as to break the molecular crystalline bonds and not break the nonmolecular crystalline bonds, and to form sputtered particles of the organic compound; and depositing sputtered particles of said organic compound on the surface of a substrate to form a film thereon.

33. The method according to claim 31 or 32, wherein said target is made by introducing into a vacuum a material substance which is in a gaseous or liquid state, and by adsorbing and solidifying said introduced material substance on the surface of a cooling head cooled to below the melting point of the material substances.

34. The method according to claim 32, wherein the particle beam applied has energy in the range of 6-10 eV.

35. An apparatus for forming a film, comprising:
a vacuum chamber;
a target disposed in said vacuum chamber and comprising an organic compound; and
a particle beam source for generating a particle beam, having energy of about 10 eV or less, to apply to said target, wherein particles are sputtered from said target by said particle beam generated by said particle beam source and are deposited on the surface of a substrate to form a film thereon.

36. The apparatus according to claim 35, wherein the particle beam source is for generating a particle beam having energy of 6-10 eV.

37. Apparatus for forming a film, comprising:
a vacuum chamber;
a target disposed in said vacuum chamber;
a particle beam source for generating a particle beam to apply to said target;
an organic compound introducing mechanism for introducing into the vacuum chamber an organic compound which is in gaseous or liquid state; and
a cooling head for cooling and holding said introduced organic compound at a temperature below the melting point thereof to form a solidified layer of said organic compound by adsorbing and solidifying said organic compound, wherein a particle beam generated by said particle beam source is applied to said solidified layer as the target to sputter said layer to deposit said sputtered particles on said substrate to form a film thereon.

38. The apparatus according to claim 37, further comprising a laser light generator for laser light irradiation of said target.

39. The apparatus according to claim 37, wherein said organic compound introducing mechanism communicates at one end with a pressure and temperature control section capable of controlling the pressure and temperature of an organic compound and has at the other end an organic compound introducing pipe provided with a blowout nozzle.

40. An apparatus for forming a film, comprising:
a vacuum chamber;
a target disposed in said vacuum chamber;
a particle beam source for generating a particle beam to apply to said target;
a substrate on which particles, ejected from said target by sputtering upon applying said particle beam to said target, are deposited to form a film;
an organic compound introducing mechanism for introducing into a vacuum an organic compound; and
a cooling head for cooling and holding said introduced organic compound at a temperature below the melting point thereof, so as to form a layer of the organic compound thereon in a solidified state, wherein said cooling head is formed in a columnar or cylindrical shape, and wherein an arrangement is made such that said substrate is movable in a direction substantially parallel with said cooling head, wherein the solidified layer of the organic compound is formed as a target on said cooling head, a particle beam from said particle beam source is applied to said target, and while said substrate is moved, a film of organic compound is formed on said substrate.

41. The apparatus according to claim 40, wherein said columnar or cylindrical cooling head is provided with a mechanism to rotate said cooling head about an axis thereof.

42. An apparatus for forming a film, comprising:
a vacuum chamber;
an introducing pipe for introducing into said vacuum chamber a gas as a material for a particle beam;
a cooling plate for cooling and holding a material gas introduced by said introducing pipe below the melting point of said material gas, and also for forming on the surface thereof a solidified layer of said material gas, the solidified layer being bonded by van der Waals forces or hydrogen bonding forces;
an ion source for applying ions to the solidified layer of said material gas, formed on the surface of said cooling plate, to eject sputtered particles from the solidified layer; and
an opening, provided at a part of said vacuum chamber, for taking out particles sputtered by said ion source, wherein a film forming chamber is provided which communicates with said opening of said vacuum chamber and is adapted to include a substrate therein, and wherein a film is formed on said substrate in said film forming chamber by utilizing particles sputtered by said ion source.

* * * * *